(12) United States Patent
Tanaka et al.

(10) Patent No.: US 8,792,755 B2
(45) Date of Patent: Jul. 29, 2014

(54) LIGHT TRANSMISSION PATH PACKAGE, LIGHT TRANSMISSION MODULE, ELECTRONIC DEVICE AND METHOD FOR MANUFACTURING LIGHT TRANSMISSION MODULE

(75) Inventors: Junichi Tanaka, Nara (JP); Hayami Hosokawa, Kyoto (JP); Naru Yasuda, Uji (JP); Yukari Terakawa, Kyoto (JP)

(73) Assignee: OMRON Corporation, Kyoto (JP)

( * ) Notice: Subject to any disclaimer, the term of this patent is extended or adjusted under 35 U.S.C. 154(b) by 1356 days.

(21) Appl. No.: 12/530,894

(22) PCT Filed: Mar. 12, 2008

(86) PCT No.: PCT/JP2008/054458
§ 371 (c)(1),
(2), (4) Date: Sep. 11, 2009

(87) PCT Pub. No.: WO2008/114657
PCT Pub. Date: Sep. 25, 2008

(65) Prior Publication Data
US 2010/0119238 A1    May 13, 2010

(30) Foreign Application Priority Data
Mar. 16, 2007  (JP) .................................. 2007-069624

(51) Int. Cl.
*G02B 6/02*  (2006.01)
*G02B 6/10*  (2006.01)
*G02B 6/122*  (2006.01)
*H04B 10/04*  (2006.01)
*H01L 21/50*  (2006.01)

(52) U.S. Cl.
USPC ........ 385/14; 385/129; 257/E21.499; 438/27; 398/182

(58) Field of Classification Search
USPC .............. 385/14, 129, 123; 398/182; 438/27; 257/E21.499
See application file for complete search history.

(56) References Cited

U.S. PATENT DOCUMENTS

| 2003/0080341 A1 | 5/2003 | Sakano et al. |
| 2003/0091301 A1 | 5/2003 | Lee et al. |

(Continued)

FOREIGN PATENT DOCUMENTS

| DE | 102006048592 A1 | 4/2008 |
| DE | 102009039982 A1 | 3/2011 |

(Continued)

OTHER PUBLICATIONS

Office Action for European Application No. 08721874.9 dated Oct. 9, 2012 (6 pages).

(Continued)

*Primary Examiner* — Akm Enayet Ullah
(74) *Attorney, Agent, or Firm* — Thomas K. Scherer

(57) ABSTRACT

A light transmission path package includes first and sealing surface adjustment members, which are arranged with facing each other by way of a light emitting/receiving element on a lead frame substrate, having a length in a normal direction of the substrate surface from the substrate surface of H2; wherein a relational expression H3<H2<H1 is satisfied where the height H1 is a distance in the normal line direction from the substrate surface to a surface of the light guide facing the substrate surface, and the height H3 is a length in the normal line direction from the substrate surface in the light emitting/receiving element. The sealing resin is filled so as to cover the first and second sealing surface adjustment members and so as not to come in contact with the light transmission path.

15 Claims, 14 Drawing Sheets

(56) References Cited

U.S. PATENT DOCUMENTS

| | | | |
|---|---|---|---|
| 2005/0175292 A1 | 8/2005 | Supper | |
| 2005/0221518 A1 | 10/2005 | Andrews et al. | |
| 2007/0069232 A1* | 3/2007 | Kameyama et al. | 257/99 |
| 2010/0119238 A1* | 5/2010 | Tanaka et al. | 398/182 |
| 2010/0221016 A1* | 9/2010 | Tanaka et al. | 398/138 |
| 2011/0217005 A1* | 9/2011 | Nakagawa et al. | 385/38 |

FOREIGN PATENT DOCUMENTS

| | | | |
|---|---|---|---|
| EP | 0424530 | A1 | 5/1991 |
| EP | 1762869 | A1 | 3/2007 |
| JP | 09027643 | A | 1/1997 |
| JP | 2000-009968 | A | 1/2000 |
| JP | 2000-214351 | A | 8/2000 |
| JP | 2002-118271 | A | 4/2002 |
| JP | 2003-258364 | A | 9/2003 |
| JP | 2004-319555 | A | 11/2004 |
| JP | 2005-062645 | A | 3/2005 |
| JP | 2005-197369 | A | 7/2005 |
| JP | 2005-202382 | A | 7/2005 |
| JP | 2006-039255 | A | 2/2006 |
| JP | 2007-005722 | A | 1/2007 |
| JP | 2007-286289 | A | 11/2007 |
| WO | 2004/068594 | A1 | 8/2004 |

OTHER PUBLICATIONS

Patent Abstract for Japanese Publication No. 2006039255 published Feb. 9, 2006 (1 page).
Patent Abstract for Japanese Publication No. 2000009968 published Jan. 14, 2000 (1 page).
Patent Abstract for Publication No. 09027643 published Jan. 28, 1997 (1 page).
Abstract of JP2005-062645, published on Mar. 10, 2005, downloaded from esp@cenet database—Worldwide, 1 page.
Abstract of JP2005-197369, published on Jul. 21, 2005, downloaded from esp@cenet database—Worldwide, 1 page.
Abstract of 2007-005722, published on Jan. 11, 2007, downloaded from esp@cenet database—Worldwide, 1 page.
Abstract of 2003-258364, published on Sep. 12, 2003, downloaded from esp@cenet database—Worldwide, 1 page.
Abstract of 2004-319555, published on Nov. 11, 2004, downloaded from esp@cenet database—Worldwide, 1 page.
Abstract of 2005-202382, published on Jul. 28, 2005, downloaded from esp@cenet database—Worldwide, 1 page.
Abstract of 2007-286289, published on Nov. 1, 2007, downloaded from esp@cenet database—Worldwide, 1 page.
Abstract of JP2000-214351, published on Aug. 4, 2000, downloaded from esp@cenet database—Worldwide, 1 page.
Abstract of JP2002-118271, published on Apr. 19, 2002, downloaded from esp@cenet database—Worldwide, 1 page.
International Search Report issued in PCT/JP2008/054458, mailed on Apr. 15, 2008, with translation, 4 pages.
Written Opinion issued in PCT/JP2008/054458, mailed on Apr. 15, 2008, 4 pages.

* cited by examiner

LIGHT TRANSMISSION PATH PACKAGE, LIGHT TRANSMISSION MODULE, ELECTRONIC DEVICE AND METHOD FOR MANUFACTURING LIGHT TRANSMISSION MODULE

TECHNICAL FIELD

The present invention relates to a light transmission path package for transmitting an optical signal, a light transmission module, an electronic device, and a manufacturing method of the light transmission module.

BACKGROUND ART

In recent years, an optical communication network enabling large capacity data communication at high speed is expanding. The optical communication network is assumed to be mounted from intra-devices to inter-device in the future. A light guide that can be arrayed is expected to realize the print wiring substrate as an optical wiring.

The light guide has a double structure of a center core, which is called a core, and a capsule called a clad, where the index of refraction of the core is higher than the clad. In other words, the optical signal entered to the core is propagated by repeating total reflection inside the core.

In recent years, in particular, realization of a flexible optical wiring mounted on a smaller and thinner commercially-off-the-shelf device with the light guide is desired. A light guide having high bendability is being developed by using a material more flexible than the prior art for the material of the core and the clad of the light guide. The data transmission between the substrates in the device can be carried out with the light guide when using the light guide having high bendability.

A mechanism of light transmission in the light guide module using the light guide will be briefly described. First, a drive portion drives the light emission of the light emitting portion (optical element) based on an externally input electrical signal, and the light emitting portion irradiates the light incident surface of the light guide with light. The light applied to the light incident surface of the light guide is introduced into the light guide, and exit from the light exit surface of the light guide. The light exit from the light exit surface of the light guide is received by a light receiving portion (optical element) and converted to an electrical signal.

The resin sealing technique is generally applied in the package of the light transmission module. The optical element can be protected from humidity and dust by filling the sealing resin to the substrate, whereby the degradation of the optical element can be prevented (e.g., see Patent Document 1 and Patent Document 2).

However, the configurations of Patent Document 1 and Patent Document 2 have the following problems.

Specifically, in the configuration of Patent Document 1, the resin is difficult to fill without including air bubbles since the resin is filled to a gap between an optical device (14) and a film optical wiring (11) formed through a bump (10), and the light transmission module is difficult to produce while maintaining a stable quality.

As disclosed in Patent Document 1 and Patent Document 2, irregularities are form on the adhering surface of the resin and the light guide due to curing and contraction of resin if the sealing resin is filled so as to closely attach to the light guide.

Thus, variation occurs in the incident/exit direction of light between the light guide and the optical element due to air bubbles and curing and contraction, and the light coupling efficiency does not stabilize.

If the light coupling efficiency is not sufficiently maintained and the coupling loss becomes large, the probability the communication error occurs becomes high, and the light guide becomes in appropriate as a communication medium.

In order to solve such problem, a resin sealing technique for covering the optical element so that the sealing resin does not adhere to the light guide can be realized, as in the example shown in FIG. 2 and FIG. 3. FIGS. 2 and 3 are cross-sectional views of the light transmission module in a case where the package including the optical element is cut in a direction perpendicular to the light transmission direction in the light guide.

The light transmission module 90 includes a package 95, a cantilever member 94, a substrate 93, a light guide 92, and an optical element 91. The cantilever member 94 and the substrate 93 are mounted on the package 95 formed with a recess having the four sides surrounded by side walls raised from a bottom plate, and the optical element 91 is mounted on the substrate 93. The cantilever member 94 supports one end of the light guide 92. The sealing resin 96 is filled so as to cover the optical element 91, and forms a sealing surface 96a.

As shown in FIG. 2 or FIG. 3, the sealing surface 96a of the sealing resin 96 does not adhere to the light guide 92, and thus the coupling loss due to curing and contraction can be reduced while protecting the optical element 91 with the sealing resin 96.

Problems to be Solved by the Invention

The configuration shown in FIG. 2 and FIG. 3 has the following problems.

The resin generally used as the sealing resin 96 is demanded to have a hydrophilic property with respect to each member to be closely attached to each in contact with member to fix the member, and to ensure stability and reliability. However, since the sealing resin 96 has a hydrophilic property, the sealing surface 96a near the sealing resin 96 and the coming in contact with portion of each member (e.g., cantilever member 96, side wall of package 95, etc.) and the sealing resin 96 may curve.

For instance, in the example shown in FIG. 2, the sealing surface 96a curves at the edge of the cantilever member 94 and tilts from the cantilever member 94 towards the side wall of the opposing package 95. The cantilever member 94 supports the other end of the light guide 92 so that the end of the light guide 92 is immediately above the optical element 91 when performing light coupling between the light guide 92 parallel to the surface of the substrate 93 and the optical element 91 of area light emitting/receiving type mounted facing upward with respect to the surface of the substrate 93. Therefore, the optical element 91 needs to be arranged at the edge of the cantilever member 94. That is, the light coupling is performed between the optical element 91 and the light guide 92 through the curved and extremely inclined sealing surface 96a.

The effect in that the coupling loss can be reduced, which is the initial object, cannot be sufficiently obtained unless the sealing surface 96a is maintained flat and horizontal. In other words, if irregularities are formed on the sealing surface 96a or the sealing surface 96a is extremely inclined or curved, the exit direction of the light from the light source deflects and varies with the sealing surface 96a as the boundary, and the light coupling efficiency consequently becomes unstable.

If the sealing surface 96a is not maintained horizontal and is not stable, the light incident/exit direction further becomes unstable if the position of the optical element 91 is even slightly (e.g., 100 μm) shifted.

In the example shown in FIG. 3, the sealing resin 96 is filled in the configuration including another member 97 (or side wall of package 95) facing the cantilever member 94 with the optical element 91 in between and near the optical element 91. However, in such case as well, the sealing surface 96a of the sealing resin 96 forms a meniscus between the cantilever member 94 and another member 97, and the sealing surface 96a extremely curves at between the optical element 91 and the light guide 92.

The light incident/exit direction does not stabilize due to the extreme curving of the sealing surface 96a, and a stable light coupling efficiency cannot be maintained.

The above problem does not occur only in the light transmission module including the cantilever member 94, and similarly occurs in the light transmission module for performing light coupling between the light guide parallel to the substrate surface and the area light emitting/receiving optical element mounted facing upward with respect to the surface, the light transmission module having a resin sealing surface in between (space exists between the sealing resin and the light guide).

Patent Document 1 Japanese Laid-Open Patent Publication No. 2000-214351 (date of publication: Aug. 4, 2000)

Patent Document 2 Japanese Laid-Open Patent Publication No. 2002-118271 (date of publication: Apr. 19, 2002)

DISCLOSURE OF THE INVENTION

In view of the above problems, it is an object of the present invention to provide a light transmission path package capable of stabilizing the light coupling efficiency in the case of performing light coupling through the resin sealing surface between the light guide parallel to the substrate surface and the area light emitting/receiving optical element mounted facing upward with respect to the substrate surface, a light transmission module, an electronic device, and a manufacturing method of the light transmission module.

Means for Solving the Problems

In order to solve the above problems, the present invention provides a light transmission path package formed by a bottom plate for mounting a substrate and side walls raised from the bottom plate so as to interiorly accommodate at least one end including an incident/exit port of an optical signal of a light transmission path including a core made of material having translucency and a clad made of material having an index of refraction different from an index of refraction of the core, an optical element for transmitting or receiving the optical signal with respect to the end, and the substrate for mounting the optical element, a sealing resin having translucency being filled inside so as to cover the optical element and so as to form a boundary between the optical element and the light transmission path; the light transmission path package including: a first sealing surface adjustment member and a second sealing surface adjustment member, which are arranged with facing each other by way of the optical element on the substrate, having a length in a normal direction of the substrate surface from the substrate surface of a height H2; wherein a relational expression H3<H2<H1 is satisfied where the height H1 is a distance in the normal line direction from the substrate surface to a surface of the light transmission path facing the substrate surface, and the height H3 is a length in the normal line direction from the substrate surface in the optical element; and the sealing resin is filled so as to cover the first sealing surface adjustment member and the second sealing surface adjustment member and so as not to come in contact with the light transmission path.

Assuming a direction in which the first sealing surface adjustment member, the optical element, and the second sealing surface adjustment member are lined is X-axis direction, a direction orthogonal to the X-axis and parallel to the substrate surface is Y-axis direction, and a normal line direction of the substrate surface is Z-axis direction.

According to the above configuration, a height (length in the Z-axis direction) H2 of the first and the second sealing surface adjustment members for supporting the sealing surface of the sealing resin is higher than a height H3 of the optical element. Inside the light transmission path package, a distance between each sealing surface adjustment member arranged so as to sandwich the optical element in the X-axis direction and the optical element is shorter than a distance between the side wall of the light transmission path package and the optical element (see e.g., FIGS. 1(a) and 1(b)).

Thus, when the sealing resin is filled so as to cover each sealing surface adjustment member, the sealing surface of the sealing resin at the portion covering the optical element is further lifted up (direction opposite to the substrate surface in the Z-axis direction) by the first and second sealing surface adjustment members arranged near the optical element than the side wall of light transmission path package. The curvature (degree of curve of the sealing surface at the cut surface in the X-axis direction) of the sealing surface supported by the sealing surface adjustment member becomes smaller due to the surface tension of the sealing resin. In other words, the sealing surface of the portion covering the optical element becomes flatter in the X-axis direction.

Furthermore, the height H2 of the first and the second sealing surface adjustment members is lower than a height (distance in the Z-axis direction from the substrate surface to the surface of the light transmission path facing the substrate face) H1 of the lower surface of the light transmission path.

Thus, the sealing resin can be filled so as not to adhere to the lower surface of the light transmission path even if the sealing resin is filled to cove reach sealing surface adjustment member. Thus, curing and contraction of the sealing resin and the deflection of the light transmission path involved therewith can be prevented.

Therefore, the sealing surface of the sealing resin at the portion covering the optical element can be stably approached to a flatter state compared a case where the first and the second sealing surface adjustment members are not arranged. As a result, the light coupling efficiency can be stabilized when performing light coupling through the sealing surface of the sealing resin between the light transmission path parallel to the substrate surface and the area light emitting/receiving optical element mounted facing upward with respect to the substrate surface.

The respective heights of the first and the second sealing surface adjustment members do not need to be the same, and may be an arbitrary height as long as H3<H2<H1 is satisfied.

In order to solve the above problems, the present invention provides a light transmission path package formed by a bottom plate for mounting a substrate and side walls raised from the bottom plate so as to interiorly accommodate at least one end including an incident/exit port of an optical signal of a light transmission path including a core made of material having translucency and a clad made of material having an index of refraction different from an index of refraction of the core, an optical element for transmitting or receiving the optical signal with respect to the end, and the substrate for mounting the optical element, a sealing resin having translucency being filled inside so as to cover the optical element and so as to form a boundary between the optical element and the light transmission path; the light transmission path package including: a sealing surface adjustment member, which is arranged on the substrate facing a support member for supporting the light transmission path by way of the optical element, having a length in a normal direction of the substrate surface from the substrate surface of a height H2; wherein a relational expression H3<H2<H1 is satisfied where the height H1 is a distance in the normal line direction from the substrate surface to a surface of the light transmission path facing the substrate surface, and the height H3 is a distance in the normal line direction from the substrate surface to a surface on an opposite side of a mounting surface at the substrate surface in the optical element; and the sealing resin is filled so as to cover the sealing surface adjustment member and so as not to come in contact with the light transmission path.

According to the above configuration, the side wall of the support member for supporting the light transmission path raised in the Z-axis direction from the substrate surface or the bottom plate of the light transmission path package and the sealing surface adjustment member arranged with facing the support member by way of the optical element support the sealing surface of the portion covering the optical element. Since the sealing resin is filled so as to cover the sealing surface adjustment member, the sealing surface thereof is lifted up by the sealing surface adjustment member.

Therefore, the sealing surface that curves at the portion coming in contact with the support member by the wetness of the sealing resin can be approached to a flatter state. The tilt of the sealing surface from the support member over to the opposing side wall can be approached to a more horizontal state (parallel to substrate surface).

Therefore, the sealing surface at the portion covering the optical element can be maintained in a flatter and horizontal state, and a stable light coupling efficiency can be consequently obtained.

In order to solve the above problems, the present invention provides a light transmission module including: an optical element for emitting or receiving an optical signal; a light transmission path, including a core made of material having translucency and a clad made of material having an index of refraction different from an index of refraction of the core, for optically coupling with the optical element to transmit an optical signal; and the above-described light transmission path package accommodating the optical element and at least one end including an incident/exit port of the optical signal in the light transmission path.

In order to solve the above problems, the present invention provides a manufacturing method of the light transmission module, the manufacturing method including the steps of: a first step of mounting an optical element on the substrate; a second step of mounting a sealing surface adjustment member, which has a length in a normal line direction of the substrate surface from the substrate surface is a height H2, on the substrate; a third step of filling a sealing resin in the light transmission path package so as to cover the sealing surface adjustment member and so as not to come in contact with the light transmission path; and a fourth step of mounting the light transmission path; wherein a relational expression H3<H2<H1 is satisfied where the height H1 is a distance in the normal line direction from the substrate surface to a surface of the light transmission path facing the substrate surface, and the height H3 is a length in the normal line direction from the substrate surface in the optical element.

According to the above manufacturing method, the sealing surface adjustment member having the height H2 satisfying the relational expression H3<H2<H1 is mounted on the substrate so as to sandwich (or surround) the optical element, and the sealing resin is filled so as to cover the sealing surface adjustment member.

Therefore, the sealing surface at the portion covering the optical element can be maintained horizontal and flat, and a light transmission module capable of obtaining a stable light coupling efficiency can be manufactured.

Effects of the Invention

As described above, the light transmission path package according to the present invention includes a first sealing surface adjustment member and a second sealing surface adjustment member, which are arranged with facing each other by way of the optical element on the substrate, having a length in a normal direction of the substrate surface from the substrate surface of the height H2; wherein a relational expression H3<H2<H1 is satisfied where the height H1 is a distance in the normal line direction from the substrate surface to a surface of the light transmission path facing the substrate surface, and the height H3 is a length in the normal line direction from the substrate surface in the optical element; and the sealing resin is filled so as to cover the first sealing surface adjustment member and the second sealing surface adjustment member and so as not to come in contact with the light transmission path.

Alternatively, the light transmission path package according to the present invention includes a sealing surface adjustment member, which is arranged on the substrate facing a support member for supporting the light transmission path by way of the optical element, having a length in a normal direction of the substrate surface from the substrate surface of the height H2; wherein a relational expression H3<H2<H1 is satisfied where the height H1 is a distance in the normal line direction from the substrate surface to a surface of the light transmission path facing the substrate surface, and the height H3 is a distance in the normal line direction from the substrate surface to a surface on an opposite side of a mounting surface at the substrate surface in the optical element; and the sealing resin is filled so as to cover the sealing surface adjustment member and so as not to come in contact with the light transmission path.

Accordingly, a stable light coupling efficiency can be obtained.

Figure 1:
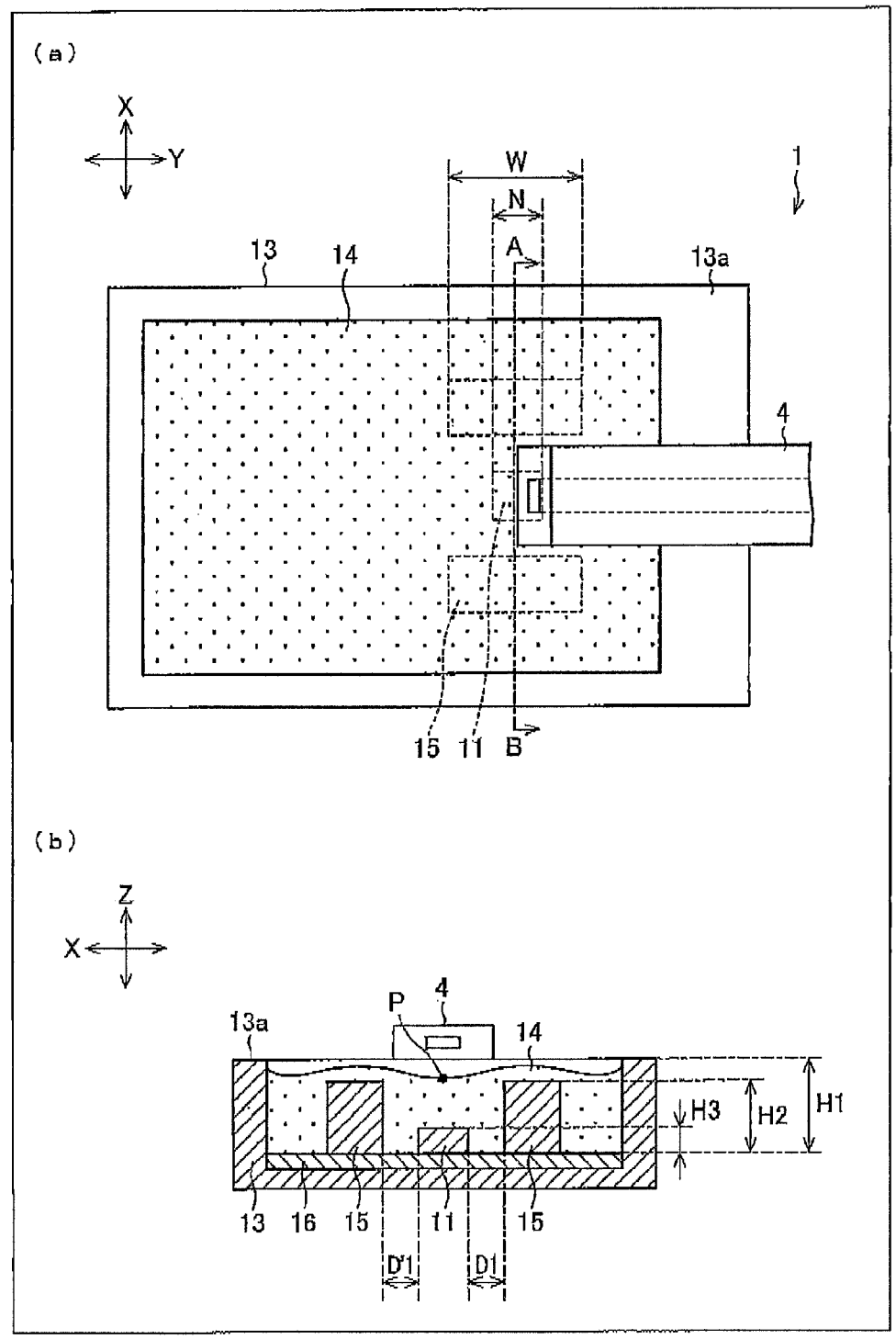
FIG. 1(a) is a plan view showing a configuration of a light transmission module according to an embodiment of the present invention, and (b) is a cross-sectional view taken along line A-B of the light transmission module.
Figure 2:
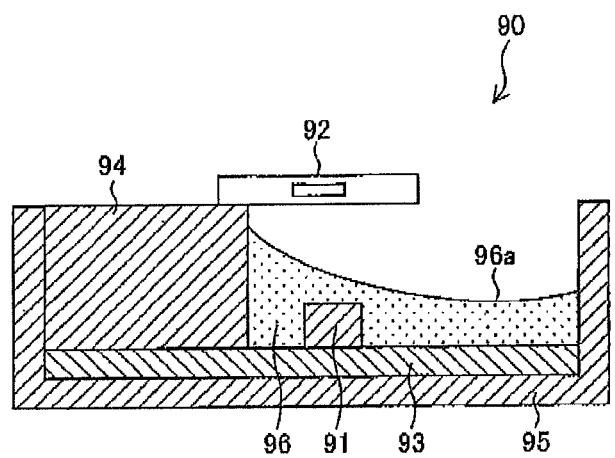
FIG. 2 is a cross-sectional view of a light transmission module in a case where a package including an optical element is cut in a direction perpendicular to a light transmission direction in a light guide.
Figure 3:
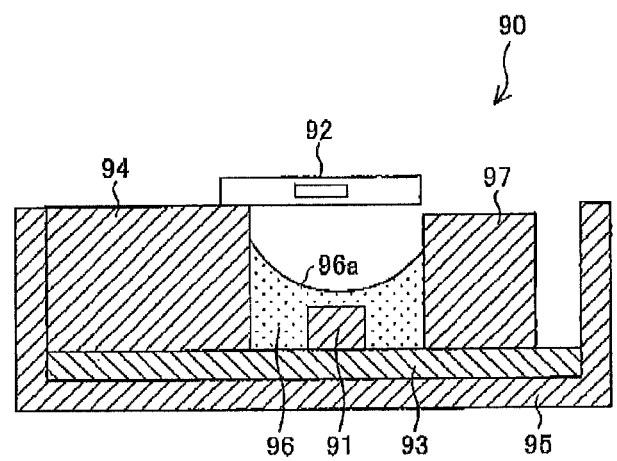
FIG. 3 is a cross-sectional view of the light transmission module in the case where the package including the optical element is cut in a direction perpendicular to the light transmission direction in the light guide.

DESCRIPTION OF SYMBOLS 1 light transmission module
2 light transmission processing unit
3 light reception processing unit
4 light guide
4A light incident surface
4B light exit surface
4a core
4b clad
4c incident/exit port
5 light emitting drive portion
5a opened surface
6 light emitting portion
7 amplifier
8 light receiving portion
11 light emitting/receiving element (optical element)
11a light emitting/receiving portion
12 bonding wire
13 package (light transmission path package/support member)
13a opened surface (support member)
14 sealing resin
15 sealing surface adjustment member
16 lead frame substrate (substrate)
17 waveguide mounting member (support member)
40 foldable portable telephone (electronic device)
40a body
41 control unit
42 external memory
43 camera
44 display unit
50 printing device (electronic device)
51 printer head
52 paper
60 hard disk recording and reproducing device (electronic device)
61 disk
62 head
63 substrate introduction portion
64 drive portion

BEST MODE FOR CARRYING OUT THE INVENTION

One embodiment of the present invention will be described below based on the drawings.

[Embodiment 1]

(Schematic Configuration of Light Transmission Module)

Figure 4:
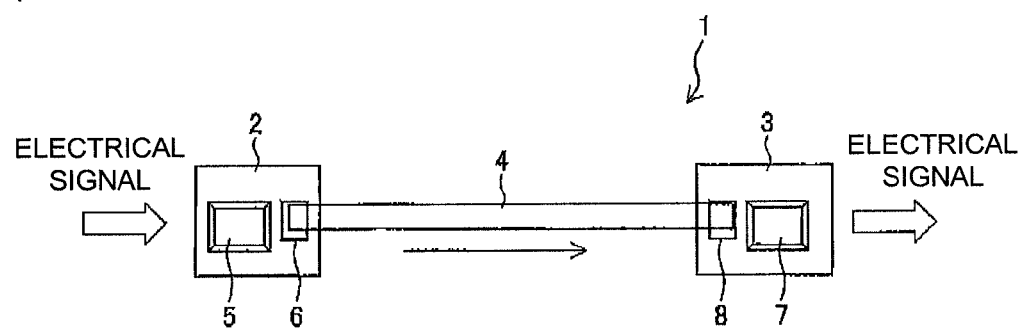
FIG. 4 is a view showing a schematic configuration of the light transmission module according to the present embodiment.

FIG. 4 is a view showing a schematic configuration of a light transmission module 1 according to the present embodiment. As shown in the figure, the light transmission module 1 includes a light transmission processing unit 2, a light reception processing unit 3, and a light guide 4 serving as a light transmission path.

The light transmission processing unit 2 has a configuration including a light emitting drive portion 5 and a light emitting portion 6. The light emitting drive portion 5 drives the light emission of the light emitting portion 6 based on an electrical signal inputted from the outside. The light emitting drive portion 5 is configured by a light emission drive IC (Integrated Circuit). Although not shown in the figure, the light emitting drive portion 5 includes an electrical connecting part with respect to an electrical wiring for transmitting the electrical signal from the outside.

The light emitting portion 6 emits light based on a drive control by the light emitting drive portion 5. The light emitting portion 6 is configured by a light emitting element such as VCSEL (Vertical Cavity-Surface Emitting Laser). A light incident side end of the light guide 4 is irradiated with the light emitted from the light emitting portion 6 as a light signal.

The light reception processing unit 3 has a configuration including an amplifier 7 and a light receiving portion 8. The light receiving portion 8 receives the light serving as a light signal exit from a light exit side end of the light guide 4, and outputs an electrical signal through photoelectric conversion. The light receiving portion 8 is configured by a light receiving element such as PD (Photo-Diode).

The amplifier 7 amplifies the electric signal outputted from the light receiving portion 8 and outputs the same to the outside. The amplifier 7 is configured by amplification IC, for example. Although not shown, the amplifier 7 includes an electrical connecting part with respect to the electrical wiring for transmitting the electrical signal to the outside.

The light guide 4 is a medium for transmitting the light exit from the light emitting portion 6 to the light receiving portion 8.

Figure 5:
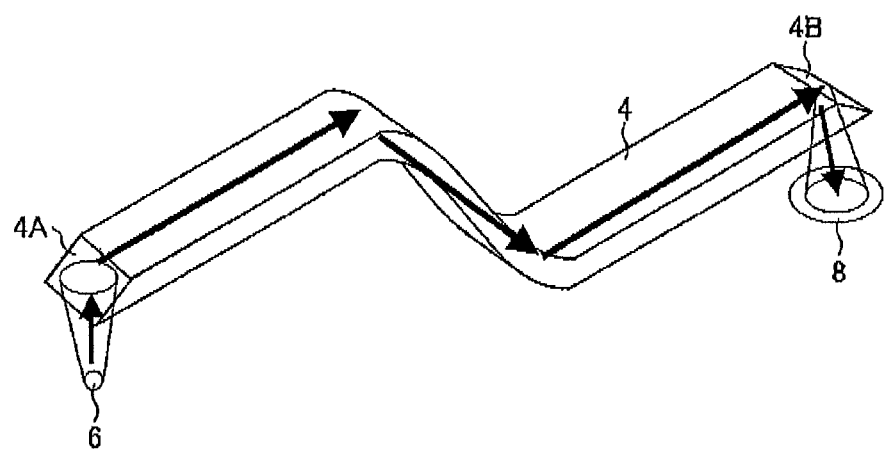
FIG. 5 is a view schematically showing the state of light transmission in the light transmission path.

FIG. 5 is a view schematically showing the state of light transmission in the light guide 4. As shown in the figure, the light guide 4 is configured by a column-shaped member having flexibility. A light incident surface 4A is arranged at the light incident side end of the light guide 4, and a light exit surface 4B is arranged at the light exit side end.

The light exit from the light emitting portion 6 enters from a direction perpendicular to the light transmission direction of the light guide 4 with respect to the light incident side end of the light guide 4. The incident light advances through the light guide 4 by being reflected at the light incident surface 4A. The light that advances through the light guide 4 and reaches the light exit side end is reflected at the light exit surface 4B and exits in a direction perpendicular to the light transmission direction of the light guide 4. The light receiving portion 8 is irradiated with the exit light, and photoelectric conversion is performed in the light receiving portion 8.

According to such a configuration, the light emitting portion 6 serving as a light source can be arranged in a horizontal direction with respect to the light transmission direction with respect to the light guide 4. Thus, if the light guide 4 needs to be arranged parallel to the substrate surface, the light emitting portion 6 is installed between the light guide 4 and the substrate surface so as to emit light in the normal direction of the substrate surface. With such a configuration, the mounting becomes easier than the configuration of installing the light emitting portion 6 so as to emit light parallel to the substrate surface. Such configuration facilitates mounting compared to the configuration of installing the light emitting portion 6 so as to emit light parallel to the substrate surface, and can be more miniaturized in regards to the configuration. This is because in the general configuration of the light emitting portion 6, the size in the direction perpendicular to the direction of emitting the light is greater than the size in the direction of emitting the light. Furthermore, application can be made to the configuration of using a plane mounting light emitting element in which the electrode and the light emitting portion are in the same plane.

FIG. 6(a) is a plan view showing a schematic configuration of the light transmission module according to the present embodiment, FIG. 6(b) is an enlarged view of the end of the light guide 4, and FIG. 6(c) is a side view showing a schematic configuration of the light transmission module 1.

The light transmission module 1 includes the light guide 4, a light emitting/receiving element (optical element) 11, a bonding wire 12, and a package 13.

The light guide 4 is formed by a core 4a having a large index of refraction and a clad 4b having a small index of refraction arranged in contact with the periphery of the core 4a, where the optical signal that entered the core 4a is propagated while being totally reflected repeatedly at the boundary of the core 4a and the clad 4b. The core 4a and the clad 4b are made of polymer material having flexibility, and thus the light guide 4 has flexibility. The light guide 4 is made of polymer, quartz and the like, and is preferably a film-type in view of flexibility.

Both end faces of the light guide 4 are processed to an inclined surface of 45 degrees, where the optical signal entering from the incident/exit port 4c of the light guide 4 is reflected at one inclined surface (light incident surface 4A), and then guided to the light guide 4. The optical signal reflected at the other inclined surface (light exit surface 4B) exits from the incident/exit port 4c. The angle of the end face of the light guide 4 is not limited to 45 degrees, and merely needs to enable the incident optical signal to be guided into the light guide 4, and thus the end face may be processed to a right angle.

The light emitting/receiving element 11 converts the electrical signal to the optical signal, and the optical signal to the electrical signal. The light emitting/receiving element 11 is an area light emitting/receiving element, and the optical signal is emitted and received from the surface on the opposite side of the mounting surface mounted inside the package 13. The light emitting/receiving element 11 can realized as a light emitting portion 6 or the light receiving portion 8 in FIG. 4.

The bonding wire 12 connects the light emitting/receiving element 11 and an electrical wiring (not shown) to transmit the electrical signal.

The package 13 is formed with a recess having the four sides surrounded by side walls raised from a bottom plate, and includes an opened surface 13a at the upper part. The opened surface 13a serves as a waveguide mounting member for supporting the light guide 4. The light guide 4, the light emitting/receiving element 11, and the bonding wire 12 are mounted in the recess of the package 13.

Figure 6:
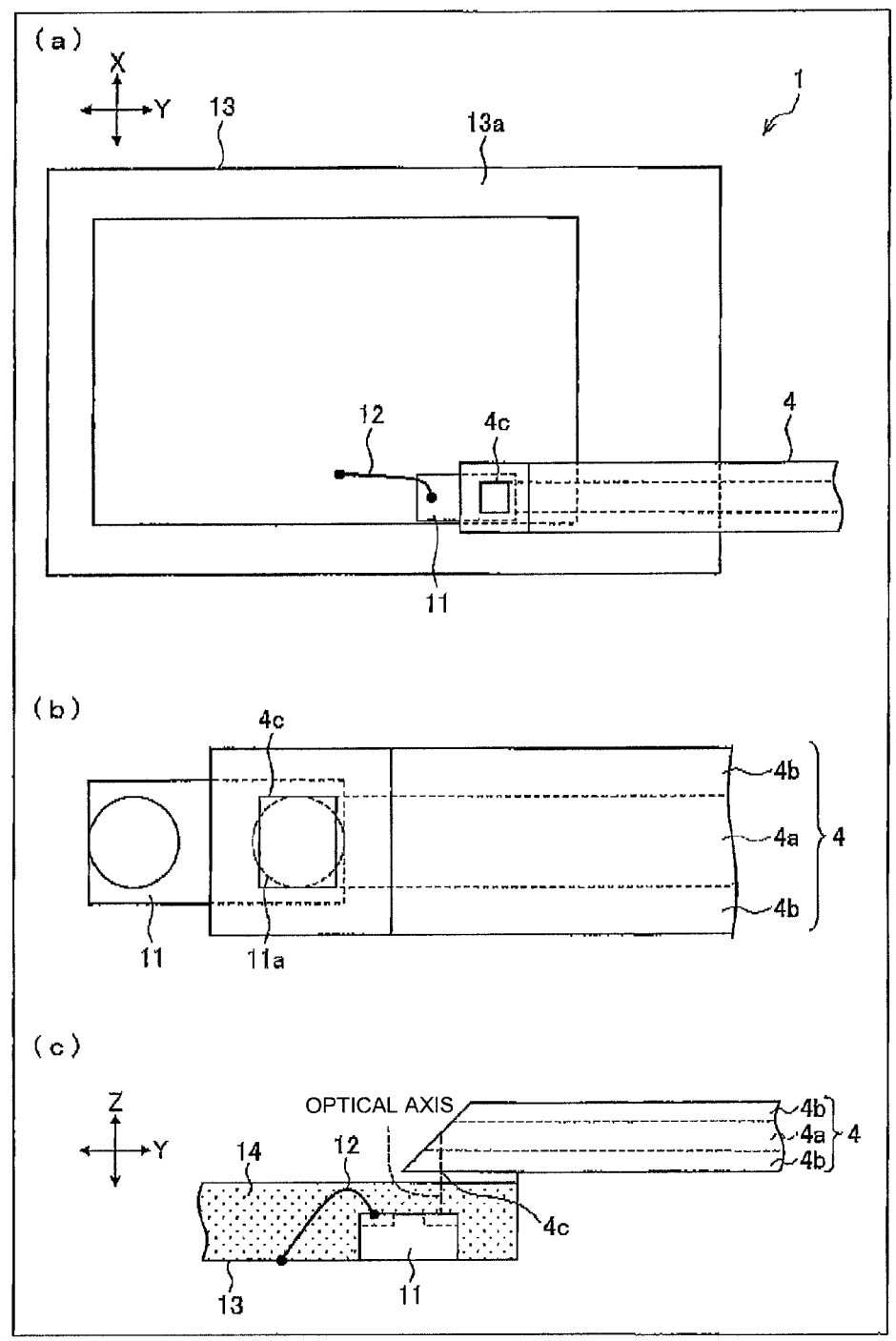
FIG. 6(a) is a plan view showing a schematic configuration of the light transmission module 1 according to the present embodiment, (b) is an enlarged view of the end of the light guide 4, and (c) is a side view showing a schematic configuration of the light transmission module 1.

The manufacturing method of the light transmission module 1 will be described below. In FIG. 1 and FIG. 6, and the following figures, the axis parallel to the longitudinal direction of the light guide 4 at the opened surface 13a of the package 13 is the Y-axis, the axis orthogonal to the Y-axis is the X-axis, the coordinate plane is the X-Y plane, and the axis orthogonal to the X-Y plane is the Z-axis.

First, the light emitting/receiving element 11, the bonding wire 12, the electrical wiring (not shown), and the electrical connecting part (not shown) are mounted to the bottom plate (lead frame substrate 16) of the package 13 fixed with a jig and the like through a method such as soldering. The light guide 4 is then gripped using an air chuck and the like, and position adjustment of the light emitting/receiving element 11 and the light guide 4 is performed by an image recognition device (not shown) installed on the upper side (Z-axis direction) of the package 13. The light guide 4 is fixed on the opened surface 13a of the package 13 through a method such as adhering at the position where the projecting portion (incident/exit port 4c) of the core 4a at the inclined end face of the light guide 4 and the light emitting/receiving portion 11a of the light emitting/receiving element 11 coincide in the picture of the image recognition device, as shown in FIG. 6(b).

The mounting position of the light emitting/receiving element 11 is not particularly limited, but the light emitting/receiving element 11 is preferably mounted near the corner in the package 13, as shown in FIG. 6(a). The periphery of the incident/exit port 4c of the light guide 4 is thereby supported in dual-axis direction of the side wall parallel to the X-axis direction and the side wall parallel to the Y-axis direction forming the package 13.

As described above, since the end of the light guide 4 is supported according to the light transmission module 1 of the present embodiment, deformation by heat and deformation caused by external force applied by mechanical factors such as vibration and dropping that occur near the incident/exit port 4c of the optical signal in the light guide 4 can be suppressed. Therefore, the fluctuation of the light coupling efficiency of the light emitting/receiving element 11 and the light guide 4 can be suppressed with a simple configuration without adopting a complex structure such as a structure of forming by adding various parts to the package 13 as with the flip chip structure.

In the present embodiment, a configuration in which the end of the light guide 4 is supported so as to be mounted on the opened surface 5a of the package 13 is adopted, but other configurations such as adhering and fixing the side surface of the light guide 4 to the surface facing the space in the package 13 at the side wall parallel to the Y-axis forming the package 13 may be adopted. The periphery of the incident/exit port 4c of the optical signal in the light guide 4 is thereby supported in two directions.

One example of the mechanism of light transmission in the light transmission module 1 manufactured in the above method will be briefly described below.

The light emitting/receiving element 11 (light emitting portion 6) receiving the electrical signal from the drive IC (light emitting drive portion 5 of FIG. 4) emits the optical signal corresponding to such electrical signal. The optical signal emitted from the light emitting/receiving element 11 is then entered from one incident/exit port 4c of the light guide 4 and reflected towards the interior of the light guide 4 at the inclined end face (light incident surface 4A). The optical signal is propagated through the light guide 4 while being repeatedly totally reflected, reflected at the inclined end face (light exit surface 4B) of the light guide 4, exit from the other incident/exit port 4c, and received by the light emitting/receiving element 11 (light receiving portion 8). The optical signal received by the light emitting/receiving element 11 is converted to an electrical signal, amplified to a desired signal value by an amplifier or the like (amplifier 7) of the next stage, and then output.

According to the present embodiment, in the manufacturing method of the light transmission module 1, the light emitting/receiving element 11 and the like are mounted on the lead frame substrate 16 through soldering or the like before mounting the light guide 4, and then a resin sealing agent (sealing resin 14) is injected into the package 13 and cured.

The sealing resin 14 may use a thermosetting silicone resin (index of refraction: 1.51). The silicone resin has a merit of excelling in transparency and chemical resistance property.

As described above, the sealing surface of the sealing resin 14 is maintained at a height (Z-axis direction) covering the light emitting/receiving element 11 and not coming in contact with the light guide 4. That is, the optical axis between the light emitting/receiving element 11 and the light guide 4 always passes through the sealing surface of the sealing resin 14. Therefore, a devisal for maintaining the sealing surface, through which the light passes, constant in a flat and horizontal state as much as possible and reducing the coupling loss of the light is required.

The configuration of the light transmission module 1 capable of forming a stable sealing surface of the sealing resin 14 will be described in more detail below using a few examples.

(Configuration 1 of Light Transmission Module)

FIG. 1(a) is a plan view showing a configuration of the light transmission module 1 according to the present embodiment, and FIG. 1(b) is a cross-sectional view taken along line A-B of the light transmission module 1 in FIG. 1(a).

The light transmission module 1 has a configuration in which the light emitting/receiving element 11 and the sealing surface adjustment member 15 are mounted on the lead frame substrate 16 arranged in the package 13, and the light guide 4 is mounted while being adhered to the opened surface 13a serving as the support. In FIG. 1 and the following figures, the bonding wire 12 is not shown, but is appropriately mounted according to the positional relationship with the light emitting/receiving element 11, the sealing surface adjustment member 15, the light guide 4, and the like, similar to FIGS. 6(a) and 6(c).

As shown in FIG. 1(a), the light emitting/receiving element 11 is arranged near the middle in the X-axis direction of the package 13, and two sealing surface adjustment members 15 are arranged with facing each other so as to sandwich the light emitting/receiving element 11 in the X-axis direction. The package 13 is filled with the sealing resin 14 so as to cover the light emitting/receiving element 11 and the sealing surface adjustment members 15.

As shown in FIG. 1(b), the length in the Z-axis direction of the sealing surface adjustment member 15, that is, the height H2 from the upper surface of the lead frame substrate 16 is between the height H3 of the light emitting/receiving element 11 and the height H1 of the lower surface of the light guide 4 (opened surface 13a).

According to the above-described configuration, the height H2 of the sealing surface adjustment member 15 supporting the sealing surface of the sealing resin 14 is higher than the height H3 of the light emitting/receiving element 11. The distance between each sealing surface adjustment member 15 arranged so as to sandwich the light emitting/receiving element 11 in the X-axis direction and the light emitting/receiving element 11 is shorter than the distance between the side wall of the package 13 and the light emitting/receiving element 11.

Thus, if the sealing resin 14 is filled so as to cover the upper surface of the sealing surface adjustment member 15, the sealing surface (cross-section in the X-axis direction) of the sealing resin 14 on the upper side of the light emitting/receiving element 11 is higher than the light emitting/receiving element 11 and is further lifted upward (Z-axis direction) by the sealing surface adjustment member 15 arranged in the vicinity of the light emitting/receiving element 11 than the side wall of the package 13. The curvature of the sealing surface supported by the upper surface of the sealing surface adjustment member 15 becomes smaller due to the surface tension of the sealing resin 14 and approaches a flatter state in the X-axis direction.

Therefore, compared to a case where the sealing surface adjustment member 15 is not arranged, a flatter sealing surface can be stably obtained at the upper side of the light emitting/receiving element 11. Consequently, the light coupling efficiency can be stabilized when performing light coupling through the sealing surface of the sealing resin 14 between the light guide 4 parallel to the surface of the lead frame substrate 16 and the light emitting/receiving element 11 of area light emitting/receiving type mounted facing upward with respect to the surface of the lead frame substrate 16.

Furthermore, the height H2 of the sealing surface adjustment member 15 is lower than the height H1 of the lower surface of the light guide 4.

Thus, the sealing resin 14 can be filled so as not to adhere to the lower surface of the light guide 4 even if the sealing resin 14 is filled so as to cover the sealing surface adjustment member 15. Thus, the curing and contraction of the sealing resin 14, and the deflection of the light guide 4 accompanied therewith can be prevented.

The width W of the sealing surface adjustment member 15 shown in FIGS. 1(a) and 1(b) is preferably wider than the width N of the light emitting/receiving element 11. The width referred to herein is the length of each member in the direction (Y-axis direction) perpendicular to the direction (X-axis direction) each member (light emitting/receiving element 11 and sealing surface adjustment member 15) is lined. The sealing surface on the upper side of the light emitting/receiving element 11 further approaches a flatter state not only in the X-axis direction but also in the Y-axis direction by satisfying width W>width N.

A more stable light coupling efficiency is thereby obtained.

Each sealing surface adjustment member 15 is preferably arranged such that a distance D1 and a distance D'1 from each sealing surface adjustment member 15 sandwiching the light emitting/receiving element 11 to the light emitting/receiving element 11 are equal.

According to such configuration, the minimal value P of the sealing surface of the sealing resin 14 is formed immediately above the light emitting/receiving element 11.

Therefore, the sealing surface of the sealing resin 14 on the upper side of the light emitting/receiving element 11 can be maintained in a more horizontal state, whereby the light coupling efficiency can be stabilized and the coupling loss can be reduced.

If the sealing surface tilts at the upper side of the light emitting/receiving element 11, light refraction occurs with the sealing surface as the boundary, and thus the incident/exit angle of the light passing between the light emitting/receiving element 11 and the incident/exit port 4c becomes wider and the light coupling efficiency degrades the greater the tilt.

If the sealing surface adjustment member 15 is arranged while sandwiching the light emitting/receiving element 11 such that the distances between the sealing surface adjustment members 15 and the light emitting/receiving element 11 are the same and the minimal value of the sealing surface comes immediately above the light emitting/receiving element 11, the sealing surface on the upper side of the light emitting/receiving element 11 can be maintained horizontal. As a result, a stable coupling efficiency can be obtained.

[Second Embodiment]

(Configuration 2 of Light Transmission Module)

FIG. 7(a) is a plan view showing a configuration of the light transmission module 1 according to another embodiment of the present invention, and FIG. 7(b) is a cross-sectional view taken along line C-D of the light transmission module 1 in FIG. 7(a).

As shown in FIG. 7(a), the sealing surface adjustment member 15 having a frame shape surrounding the four sides of the light emitting/receiving element 11 may be arranged.

According to such configuration, effects similar to the configuration described above in which two sealing surface adjustment members 15 are arranged so as to sandwich the light emitting/receiving element 11 in the X-axis direction, as shown in FIG. 1(b), can be obtained. In other words, the curvature of the sealing surface in the X-axis direction at the upper side of the light emitting/receiving element 11 may be reduced and flattened.

As shown in FIG. 7(b), the sealing surface adjustment member 15 is arranged so as to sandwich the light emitting/receiving element 11 not only in the X-axis direction but also in the Y-axis direction.

Therefore, the curvature of the sealing surface in the Y-axis direction at the upper side of the light emitting/receiving element 11 can be reduced and further flattened.

In the example shown in FIGS. 7(a) and 7(b), the distance of the light emitting/receiving element 11 and one side wall of the package 13 is spaced apart. Thus, the sealing surface of the sealing resin 14 greatly tilts from the side wall on the side where the light guide 4 is mounted inside the package 13 to the side wall opposing in the Y-axis direction in addition to being curved at the upper side of the light emitting/receiving element 11.

Thus, according to the above-described configuration, the sealing surface adjustment member 15 is arranged near the light emitting/receiving element 11 than the opposing side wall of the package 13, and thus can lift up the sealing surface tilted over the side wall. Therefore, the tilt of the sealing surface in the Y-axis direction at the upper side of the light emitting/receiving element 11 can be reduced and the sealing surface can be maintained in a more horizontal state.

Therefore, the sealing surface can be maintained more flat and horizontal in both directions of the X-axis direction and the Y-axis direction, and a stable light coupling efficiency can be obtained.

Moreover, the influence of density, dropped amount, and the like of the sealing resin 14 is less likely to be subjected by surrounding the four sides of the light emitting/receiving element 11 with the sealing surface adjustment member 15, whereby a more flat and horizontal sealing surface can be stably obtained. The fluctuation of the light coupling efficiency thus can be suppressed.

(Variant)

Figure 8:
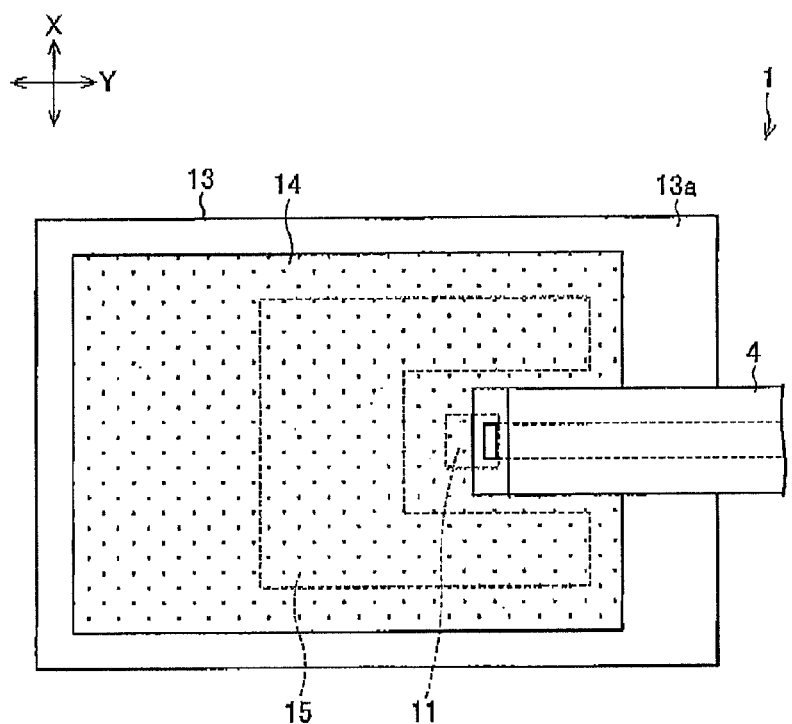
FIG. 8 is a plan view showing a configuration of a light transmission module serving as a variant.

As shown in FIG. 8, the sealing surface having a U shape may be arranged so as to surround three sides of the light emitting/receiving element 11. FIG. 8 is a plan view showing a configuration of the light transmission module 1 according to another embodiment of the present invention.

The light transmission module 1 can be made to be lighter compared to the configuration of surrounding the four sides of the light emitting/receiving element 11 while maintaining the sealing surface flat and horizontal in both the X-axis direction and the Y-axis direction.

[Third Embodiment]

(Configuration 3 of Light Transmission Module)

FIG. 9(a) is a plan view showing a configuration of the light transmission module 1 according to another embodiment of the present invention, and FIG. 9(b) is a cross-sectional view taken along line C-D of the light transmission module 1 in FIG. 9(a).

As shown in FIGS. 9(a) and 9(b), since the light emitting/receiving element 11 is arranged near a member (side wall of package 13 herein) supporting the light guide 4, the sealing surface adjustment member 15 may not be arranged between the support member and the light emitting/receiving element 11.

In such case, one sealing surface adjustment member 15 may be arranged so as to sandwich the light emitting/receiving element 11 in between the member supporting the light guide 4.

According to the above configuration, the sealing surface adjustment member 15 is arranged with opposing the side wall of the package 13 supporting the light guide 4, as shown in FIG. 9(a). In the Y-axis direction, the light emitting/receiving element 11 is sandwiched by the side wall of the package 13 and the sealing surface adjustment member 15. The sealing resin 14 is filled so as to cover the sealing surface adjustment member 15.

Therefore, the sealing surface of the sealing resin 14 is lifted up by the upper surface of the sealing surface adjustment member 15 and maintained in a more horizontal state. The sealing surface approaches a more horizontal state in the Y-axis direction by arranging the sealing surface adjustment member 15 such that the distance between the side wall of the package 13 on the supporting side of the light guide 4 and the light emitting/receiving element 1 becomes equal.

Since the sealing surface adjustment member 15 lifts up the sealing surface near the light emitting/receiving element 11 than the side wall opposing the side wall of the package 13 supporting the light guide 4, the curvature of the meniscus of the sealing surface formed at the edge of the side wall of the package 13 by the wetting property of the sealing resin 14 can be further reduced, and the sealing surface on the upper side of the light emitting/receiving element 11 in the Y-axis direction becomes a more flatter state.

Therefore, compared to a case where the sealing surface adjustment member 15 is not arranged, a more flat and horizontal sealing surface can be stably obtained at the upper side of the light emitting/receiving element 11. As a result, the light coupling efficiency can be stabilized when performing light coupling through the sealing surface of the sealing resin 14 between the light guide 4 parallel to the surface of the lead frame substrate 16 and the light emitting/receiving element 11 of area light emitting/receiving type mounted facing upward with respect to the surface of the lead frame substrate 16.

Furthermore, since only one sealing surface adjustment member 15 is arranged, the space can be saved compared to a case of arranging two sealing surface adjustment members 15.

(Variant)

Figure 10:
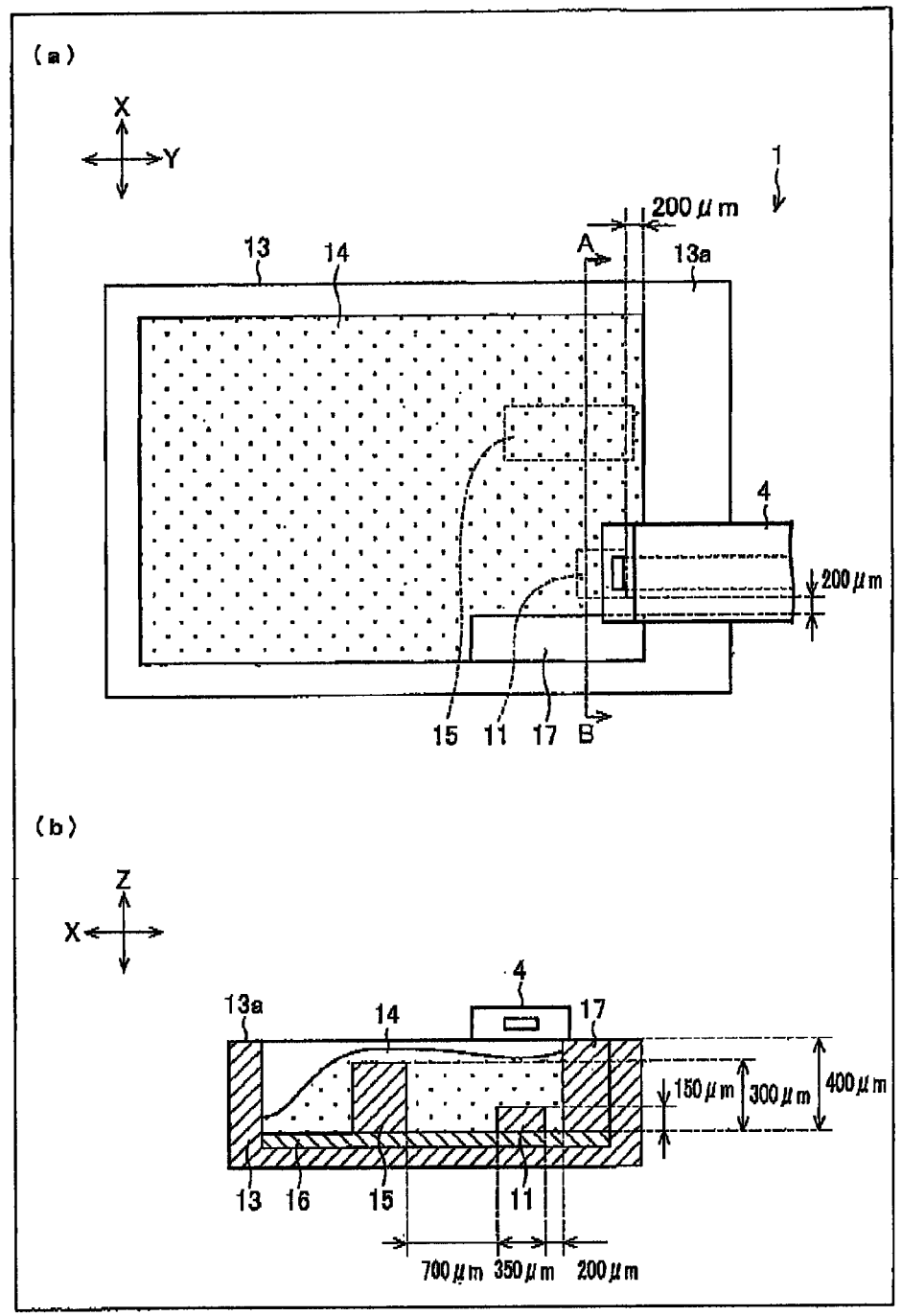
FIG. 10(a) is a plan view showing a configuration of a light transmission module serving as another variant, and (b) is a cross-sectional view taken along line A-B of the light transmission module.

As shown in FIGS. 10(*a*) and 10(*b*), the above-described configuration can be applied even if the sealing surface adjustment member 15 cannot be arranged between the waveguide mounting member 17 and the light emitting/receiving element 11 since the waveguide mounting member 17 supports the clad of the light guide 4. The waveguide mounting member 17 supports the light guide 4 and acts to prevent the light guide 4 from deflecting.

In other words, one sealing surface adjustment member 15 is to be arranged so as to sandwich the light emitting/receiving element 11 in between the waveguide mounting member 17.

FIG. 10(*a*) is a plan view showing a configuration of the light transmission module 1 according to another embodiment of the present invention, and FIG. 10(*b*) is a cross-sectional view taken along line A-B of the light transmission module 1 in FIG. 10(*a*).

Figure 9:
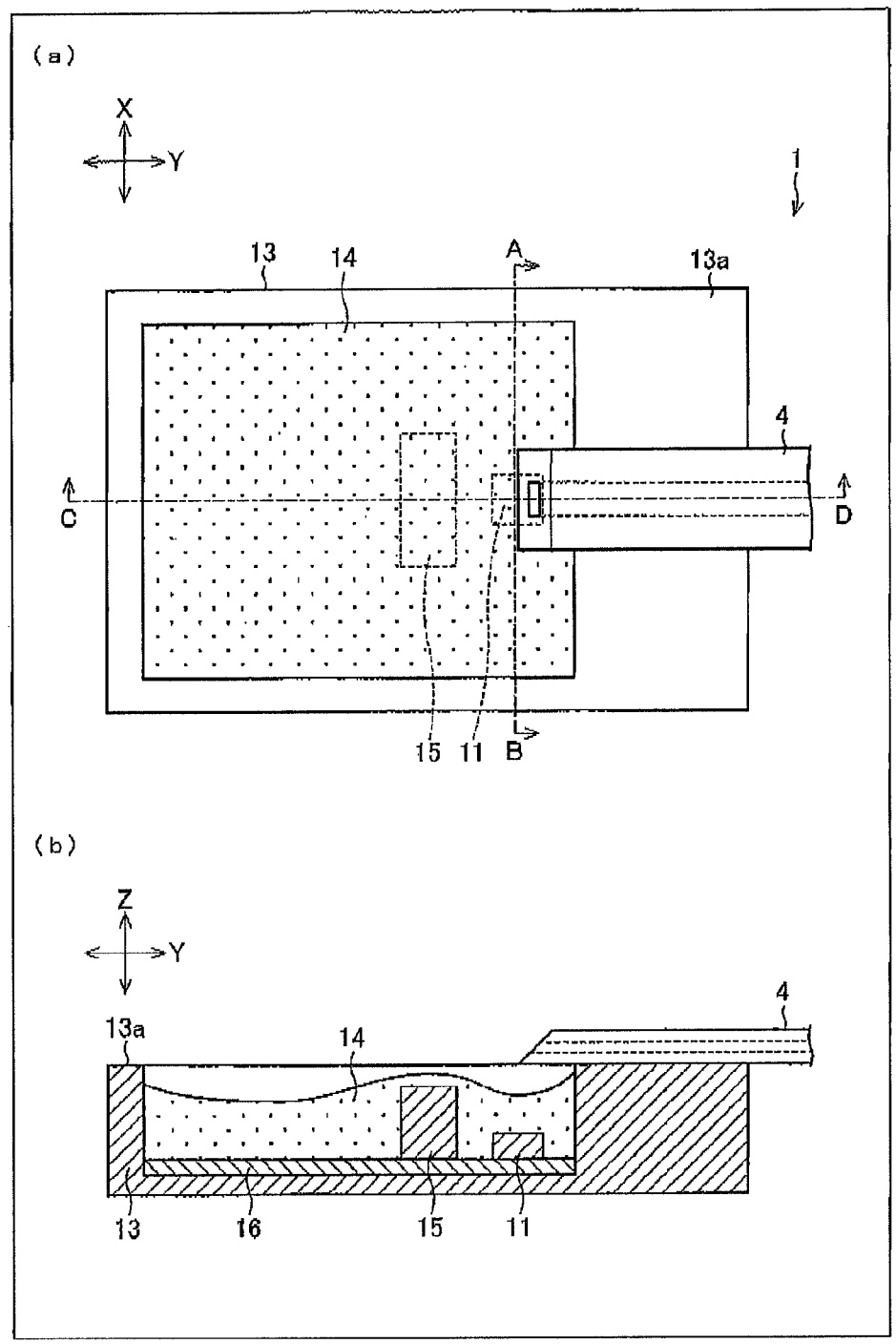
FIG. 9(a) is a plan view showing a configuration of a light transmission module according to another embodiment of the present invention, and (b) is a cross-sectional view taken along line C-D of the light transmission module.

Thus, effects substantially similar to the configuration shown in FIGS. 9(*a*) and 9(*b*) can be obtained while preventing the deflection of the light guide 4.

The numerical values of the size, height, and the distance between the members of each member shown in FIGS. 10(*a*) and 10(*b*) are merely examples, and the configuration of the light transmission module 1 of the present invention is not limited thereto.

[Fourth Embodiment]

(Configuration 4 of Light Transmission Module)

Figure 11:
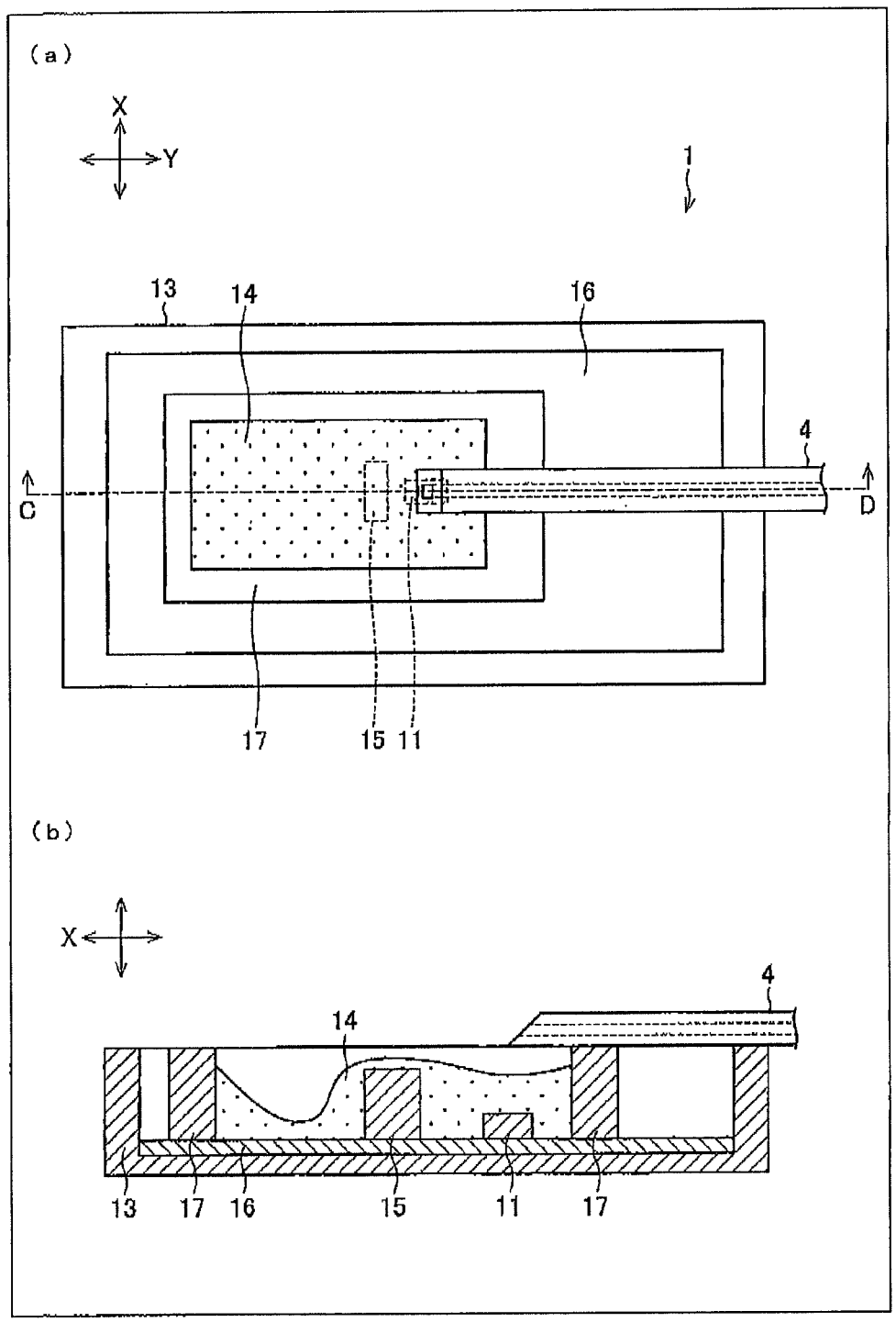
FIG. 11(a) is a plan view showing a configuration of a light transmission module according to another embodiment of the present invention, and (b) is a cross-sectional view taken along line C-D of the light transmission module.

FIG. 11(*a*) is a plan view showing a configuration of the light transmission module 1 according to another embodiment of the present invention, and FIG. 11(*b*) is a cross-sectional view taken along line C-D of the light transmission module 1 in FIG. 11(*a*).

In the example shown in FIGS. 11(*a*) and 11(*b*), the waveguide mounting member 17 having a frame shape is arranged so as to surround the light emitting/receiving element 11 in the package 13. Different from the example shown in FIGS. 10(*a*) and 10(*b*), the waveguide mounting member 17 is arranged in a state not adhering to the side wall of the package 13. The sealing resin 14 is filled in the frame of the waveguide mounting member 17.

One sealing surface adjustment member 15 is arranged so as to sandwich the light emitting/receiving element 11 in the Y-axis direction in between the waveguide mounting member 17.

Thus, as shown in FIG. 11(*b*), the sealing surface lifted up by the upper surface of the sealing surface adjustment member 15 approaches a more horizontal state in the Y-axis direction, and becomes more flat as the curvature becomes smaller by the surface tension of the sealing resin 14.

Furthermore, the sealing resin 14 is only filled by a small amount in a small space in the frame of the waveguide mounting member 17, and thus the shape in a case where the sealing surface is formed is suppressed from varying.

Therefore, sealing can be performed with the size (i.e., range smaller than the package 13) of the frame-shaped waveguide mounting member 17, and thus variation in the shape of the formed sealing surface is eliminated, and the sealing surface can be more stably maintained in a horizontal and flat state in the Y-axis direction.

As a result, the stable light coupling efficiency can be maintained.

(Variant)

Figure 12:
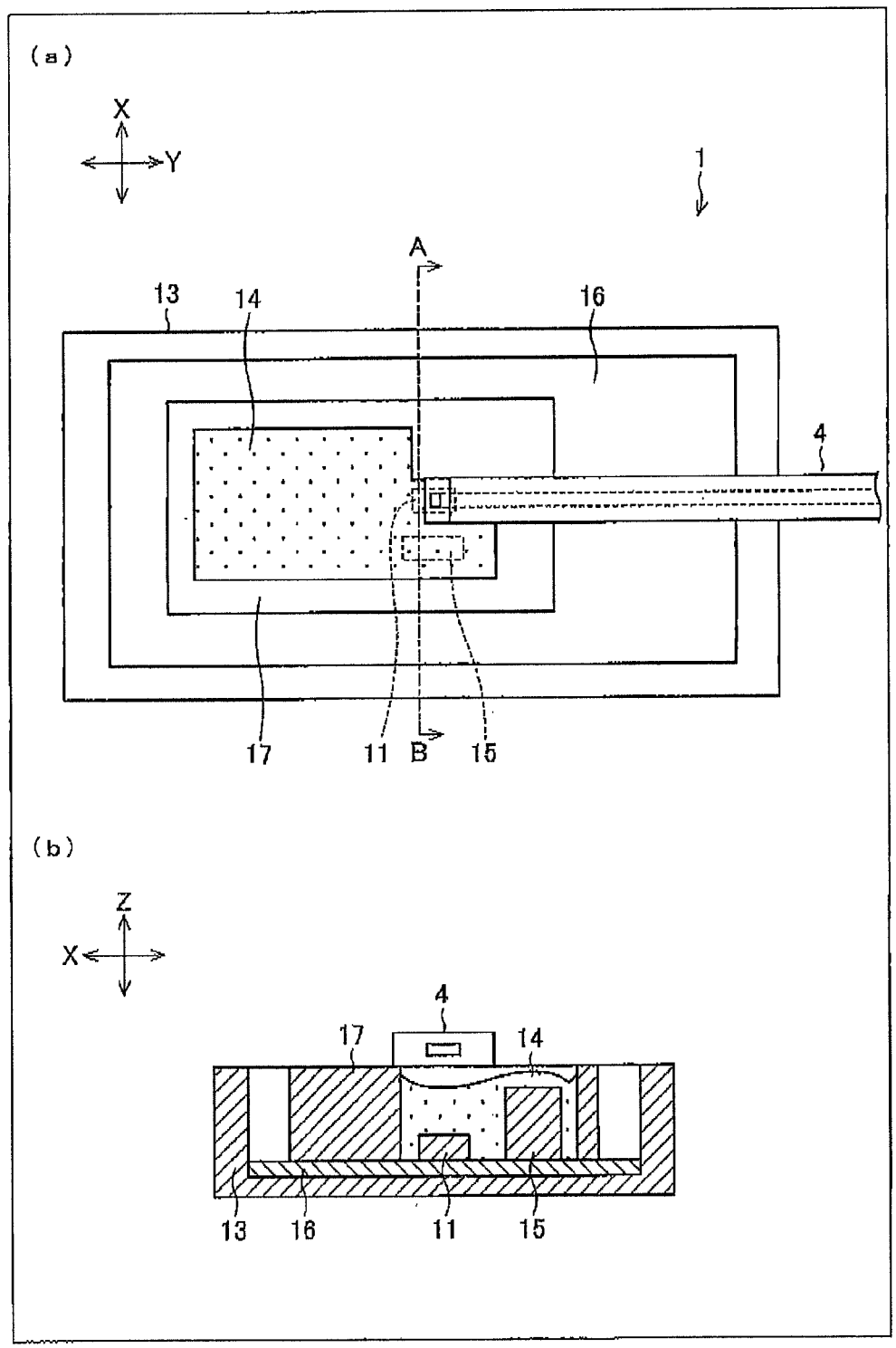
FIG. 12(a) is a plan view showing a configuration of a light transmission module serving as another variant, and (b) is a cross-sectional view taken along line A-B of the light transmission module.

As shown in FIGS. 12(*a*) and 12(*b*), the light emitting/receiving element 11 may be mounted near the corner inside the waveguide mounting member 17. Thus, the periphery of the incident/exit port 4*c* of the light guide 4 can be supported in dual-axes direction of the side wall parallel to the X-axis direction and the side wall parallel to the Y-axis direction forming the waveguide mounting member 17.

In the example shown in FIGS. 12(*a*) and 12(*b*), the sealing surface adjustment member 15 is arranged to sandwich the light emitting/receiving element 11 in the X-axis direction in between the waveguide mounting member 17.

The deformation by heat and the deformation caused by external force applied by mechanical factors such as vibration and dropping that occur near the incident/exit port 4*c* of the optical signal in the light guide 4 can be suppressed, and the sealing surface can be maintained horizontal and flat in the X-axis direction.

The material and the function of the sealing surface adjustment member 15 in each embodiment are not particularly limited. For instance, the electrical element such as a resistor or an electronic element such as a transistor to be originally mounted on the lead frame substrate 16 may be mounted as the sealing surface adjustment member 15. The bare chip of the IC and the like can be used as the sealing surface adjustment member 15.

The additional member becomes unnecessary by also using various types of electrical elements and electronic elements that need to be originally mounted as the sealing surface adjustment member 15, whereby a light transmission module 1 of reduced space can be realized.

(Manufacturing Method of Light Transmission Module)

Figure 13:
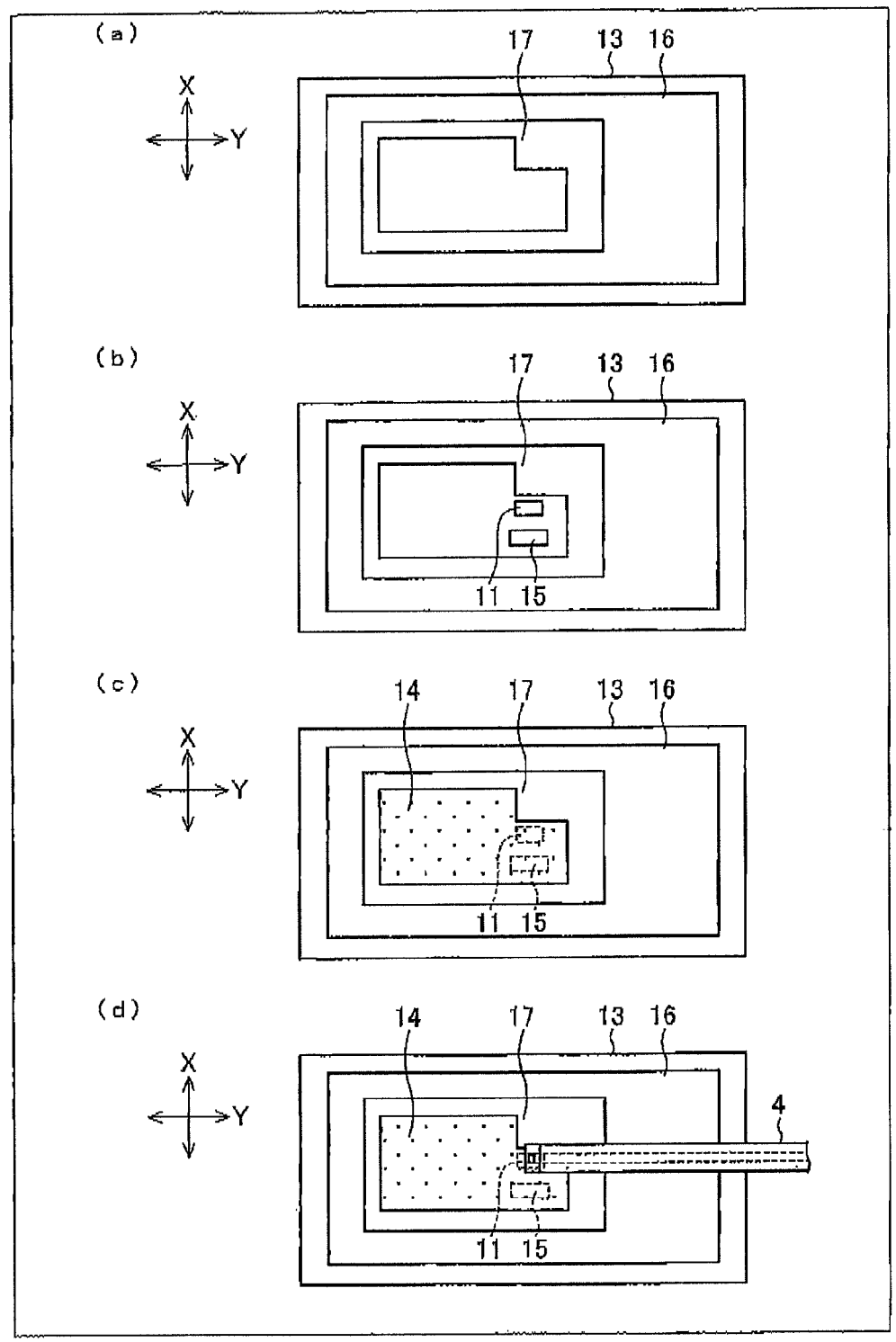
FIG. 13 is a view showing a configuration of the light transmission module in each step of the light transmission module manufacturing steps of the present invention.

The manufacturing method of the light transmission module 1 will be described in detail based on FIG. 13. FIG. 13 is a view showing the configuration of the light transmission module in each step of the light transmission module manufacturing method of the present invention.

First, as shown in FIG. 13(*a*), the waveguide mounting member 17 having a frame shape is mounted on the bottom plate (lead frame substrate 16) of the package 13 fixed by jig and the like.

Then, as shown in FIG. 13(*b*), various types of electrical elements and electronic elements are mounted in the frame of the waveguide mounting member 17. In the present embodiment, the electrical elements and the electronic elements to be mounted on the lead frame substrate 16 are also used as the sealing surface adjustment member 15. Specifically, the light emitting/receiving element 11, the bonding wire 12, the electrical wiring (not shown), and the electrical connecting part (not shown) are mounted through a method such as soldering. In the example shown in FIG. 13(*b*), the light emitting/receiving element 11 is arranged near the corner of the waveguide mounting member 17, and the necessary electrical element and electronic element (i.e., sealing surface adjustment member 15) is arranged to sandwich the light emitting/receiving element 11 in between the waveguide mounting member 17. In this case, the sealing surface adjustment member 15 that is lower than the side wall of the package 13 and higher than the light emitting/receiving element 11 is used.

Thereafter, as shown in FIG. 13(c), the sealing resin 14 is filled into the waveguide mounting member 17. The sealing resin 14 is filled until covering the upper surface of the sealing surface adjustment member 15. However, in order to prevent adhering with the light guide 4, the sealing resin 14 is filled so as not to exceed the height of the side wall of the waveguide mounting member 17 (package 13). Thus, the light emitting/receiving element 11 and the sealing surface adjustment member 15 are completely sealed by the sealing resin 14, and the height of the sealing surface is maintained lower than the waveguide mounting member 17 (package 13).

Finally, as shown in FIG. 13(d), the light guide 4 is mounted. More specifically, as shown in FIG. 6(b), the light guide 4 is gripped using the air chuck or the like, and position adjustment of the light emitting/receiving element 11 and the light guide 4 is performed by the image recognition device (not shown) installed on the upper side (Z-axis direction) of the package 13. The light guide 4 is fixed through the method such as adhering on the opened surface of the waveguide mounting member 17 at the position where the projecting portion (incident/exit port 4c) of the core at the inclined end face of the light guide 4 and the light emitting/receiving portion 11a of the light emitting/receiving element 11 coincide in the picture of the image recognition device.

According to the configuration of the light transmission module 1 manufactured through the above manufacturing steps, the light emitting/receiving element 11 is sandwiched by the waveguide mounting member 17 and the sealing surface adjustment member 15 at closer to the side wall of the package 13. The sealing resin 14 is filled so as to cover the sealing surface adjustment member 15, and thus the sealing surface is lifted up by the upper surface of the sealing surface adjustment member 15. Thus, the tilt of the inclined surface in the X-axis direction on the upper side of the light emitting/receiving element 11 becomes small and becomes more horizontal.

In addition, the curvature of the sealing surface in the X-axis direction on the upper side of the light emitting/receiving element 11 becomes small and more flat by the surface tension of the sealing resin 14.

The sealing surface in the Y-axis direction can be maintained horizontal and flat by arranging the sealing surface adjustment member 15 so as to sandwich the light emitting/receiving element 11 in between the waveguide mounting member 17 in the Y-axis direction.

Therefore, according to the above-described manufacturing steps, a more stable light coupling efficiency can be obtained, and as a result, the light transmission module 1 capable of protecting the light emitting/receiving element 11 from humidity and dust, preventing the deflection of the light guide 4 due curing and contraction of resin and reducing the coupling loss can be manufactured.

(Application Example)

The light guide 4 of the present invention can be applied to the following application examples.

First, as a first application example, use can be made at a hinge portion in a foldable electronic device such as a foldable portable telephone, a foldable PHS (Personal Handyphone System), a foldable PDA (Personal Digital Assistant), and a foldable notebook computer.

Figure 14:
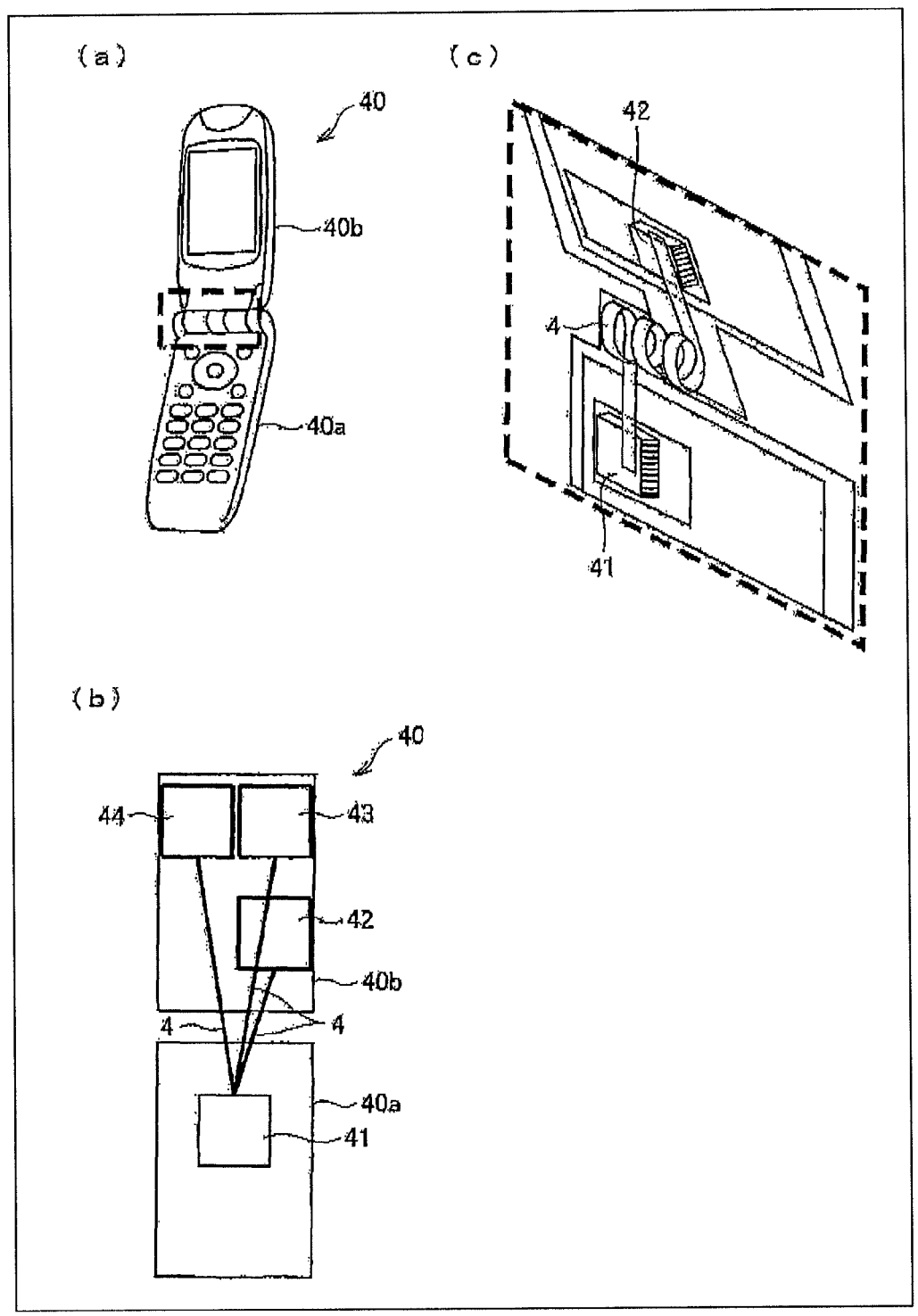
FIG. 14(a) is a perspective view showing an outer appearance of a foldable portable telephone including the light transmission path according to the present embodiment, (b) is a block diagram of a portion where the light transmission path is applied in the foldable portable telephone shown in (a), and (c) is a perspective plan view of a hinge portion in the foldable portable telephone shown in (a).

FIGS. 14(a) to (c) show an example in which the light guide 4 is applied to a foldable portable telephone 40. In other words, FIG. 14(a) is a perspective view showing an outer appearance of the foldable portable telephone 40 incorporating the light guide 4.

FIG. 14(b) is a block diagram of a portion where the light guide 4 is applied in the foldable portable telephone 40 shown in FIG. 14(a). As shown in the figure, a control unit 41 arranged on a body 40a side in the foldable portable telephone 40, an external memory 42, a camera (digital camera) 43, and a display unit (liquid crystal display) 44 arranged on a lid (drive portion) 40b side rotatably arranged at one end of the body with the hinge portion as a shaft are connected by the light guide 4.

FIG. 14(c) is a perspective plan view of the hinge portion (portion surrounded with a broken line) in FIG. 14(a). As shown in the figure, the light guide 4 is wrapped around a supporting rod at the hinge portion and bent to thereby connect the control unit arranged on the body side, and the external memory 42, the camera 43, and the display unit 44 arranged on the lid side.

High speed and large capacity communication can be realized in a limited space by applying the light guide 4 to the foldable electronic device. Therefore, it is particularly suitable in devices where high speed and large capacity data communication is necessary and miniaturization is demanded such as the foldable liquid crystal display.

As a second application example, the light guide 4 is applied to a device having a drive portion such as a printer head in a printing device (electronic device) and a reading unit in a hard disk recording and reproducing device.

Figure 15:
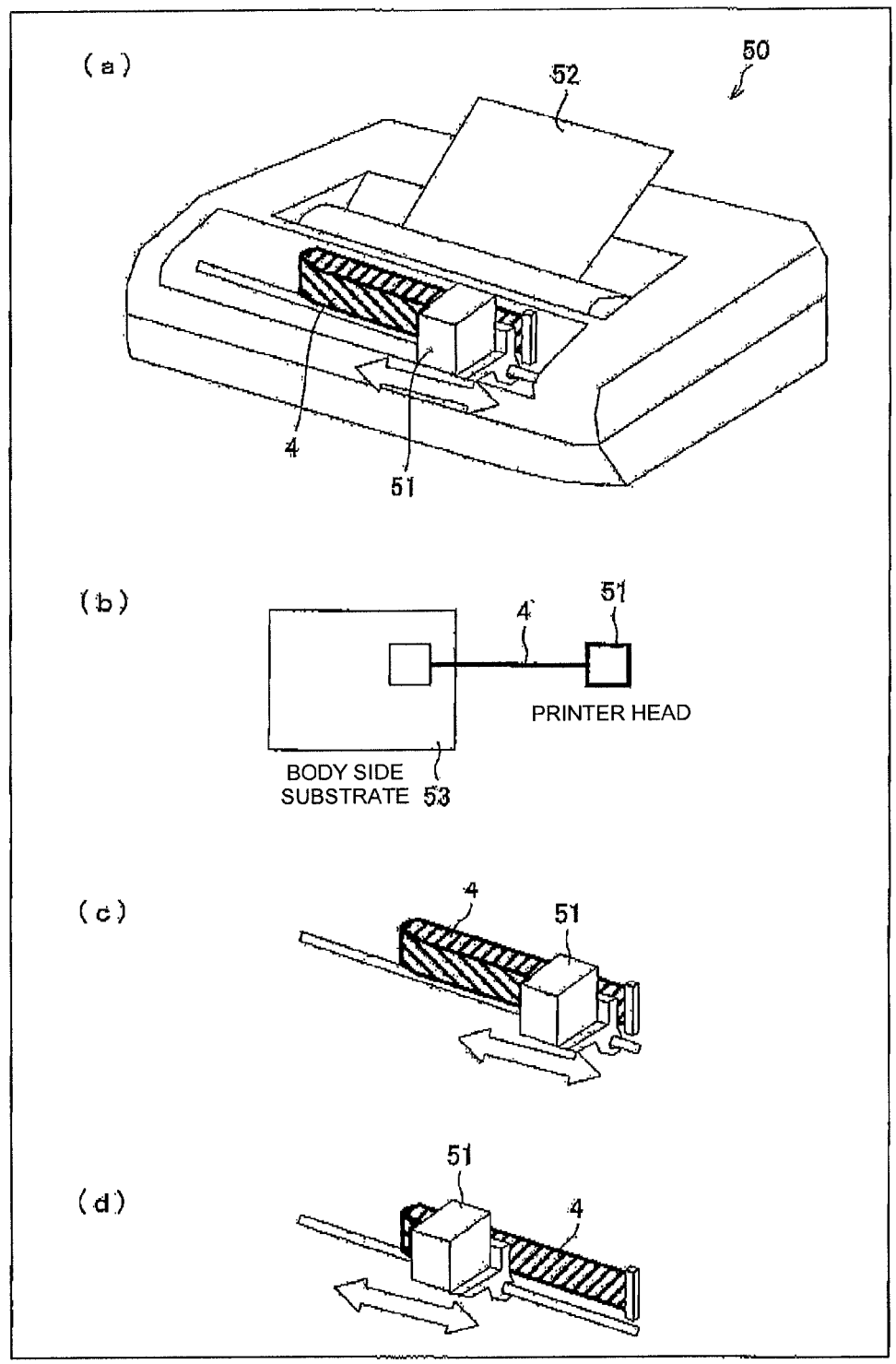
FIG. 15(a) is a perspective view showing an outer appearance of a printing device including the light transmission path according to the present embodiment, (b) is a block diagram showing the main parts of the printing device shown in (a), and (c) and (d) are perspective views showing a curved state of the light transmission path when the printer head is moved (driven) in the printing device.

FIGS. 15(a) to (c) show an example in which the light guide 4 is applied to a printing device 50. FIG. 15(a) is a perspective view showing an outer appearance of the printing device 50. As shown in this figure, the printing device 50 includes a printer head 51 for performing printing on a paper 52 while moving in a width direction of a paper 52, where one end of the light guide 4 is connected to the printer head 51.

FIG. 15(b) is a block diagram of a portion where the light guide 4 is applied in the printing device 50. As shown in the figure, one end of the light guide 4 is connected to the printer head 51, and the other end is connected to a body side substrate in the printing device 50. The body side substrate includes control means etc. for controlling the operation of each unit of the printing device 50, and the like.

FIG. 15(c) and FIG. 15(d) are perspective views showing a curved state of the light guide 4 when the printer head 51 is moved (driven) in the printing device 50. As shown in the figures, when the light guide 4 is applied to the drive portion such as the printer head 51, the curved state of the light guide 4 changes by the drive of the printer head 51 and each position of the light guide 4 repeatedly curves.

Therefore, the light guide 4 according to the present embodiment is suitable for such drive portions. Furthermore, high speed and large capacity communication using the drive portion can be realized by applying the light guide 4 to such drive portions.

Figure 16:
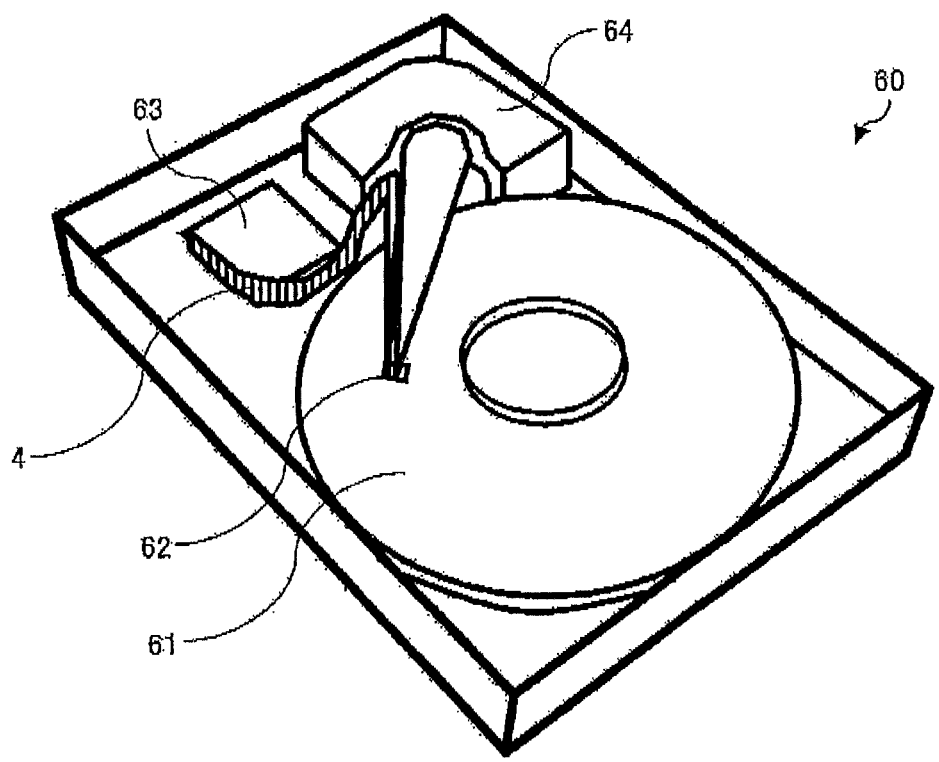
FIG. 16 is a perspective view showing an outer appearance of a hard disc recording and reproducing device including the light transmission path according to the present embodiment.

FIG. 16 shows an example in which the light guide 4 is applied to a hard disk recording and reproducing device 60.

As shown in the figure, the hard disk recording and reproducing device 60 includes a disk (hard disk) 61, a head (read/write head) 62, a substrate introducing portion 63, a drive portion (drive motor) 64, and the light guide 4.

The drive portion 64 drives the head 62 along a radial direction of the disk 61. The head 62 reads the information recorded on the disk 61 and writes information on the disk 61. The head 62 is connected to the substrate introducing portion

63 by way of the light guide 4, and propagates the information read from the disk 61 to the substrate introducing portion 63 as a light signal and receives the light signal of the information to write to the disk 61 propagated from the substrate introducing portion 63.

Therefore, high speed and large capacity communication can be realized by applying the light guide 4 to the drive portion such as the head 62 in the hard disk recording and reproducing device 60.

(Supplementary Matters—Means for Solving the Problems)

Furthermore, assuming the direction in which the first sealing surface adjustment member, the optical element, and the second sealing surface adjustment member are lined is the X-axis direction and the direction orthogonal to the X-axis direction and parallel to the substrate surface is the Y-axis direction in the light transmission path package, the length in the Y-axis direction of each sealing surface adjustment member is preferably longer than the length in the Y-axis direction in the optical element at the surface on the opposite side of the mounting surface in at least the substrate surface of each sealing surface adjustment member.

According to the above configuration, each sealing surface adjustment member maintains the sealing surface in a more flat state by being arranged while sandwiching the optical element in the X-axis direction, and lifts up the sealing surface to be maintained in a more flat state by the upper surface (surface opposite to the surface coming in contact with the substrate) of the sealing surface adjustment member extending long in the Y-axis direction than the optical element in the Y-axis direction.

Thus, the sealing surface of the portion covering the optical element approaches a more flat state not only in the X-axis direction but also in the Y-axis direction orthogonal thereto. As a result, a more stable light coupling efficiency can be obtained.

Furthermore, assuming the direction in which the first sealing surface adjustment member, the optical element, and the second sealing surface adjustment member are lined is the X-axis direction in the light transmission path package, the minimal point of the sealing surface of the sealing resin formed between the first sealing surface adjustment member and the second sealing surface adjustment member at the cross section in a direction parallel to the X-axis direction and perpendicular to the substrate surface is preferably in a region formed between the optical element and the light transmission path when projecting the light emitting surface of the optical element in the light transmission path direction in the direction perpendicular to the substrate surface.

The minimal point (e.g., point P of FIG. 1(*b*)) is the point where the distance from the substrate surface takes a minimum value of the curved portion of the sealing surface of the sealing resin formed on the upper side of the optical element at the cross section in a direction parallel to the X-axis direction and perpendicular to the substrate surface.

According to the above configuration, the sealing surface of the sealing resin is formed such that the minimal point is the space between the optical element and the light transmission path and is immediately above the optical element.

Thus, the tilt of the sealing surface covering the optical element can be reduced to maintain a more horizontal state (parallel to substrate surface), whereby the light coupling efficiency can be stabilized and the coupling loss can be reduced.

In the light transmission path package, a distance D1 between the surfaces facing each other of the optical element and the first sealing surface adjustment member and a distance D2 between the surfaces facing each other of the optical element and the second sealing surface adjustment member are preferably equal.

According to the above-described configuration, the minimal point (e.g., point P of FIG. 1(*b*)) i.e., the point where the distance in the Z-axis direction from the substrate surface becomes a minimum value in the sealing surface of the sealing resin of the portion covering the optical element is formed immediately above the optical element.

Thus, the tilt of the sealing surface covering the optical element can be reduced to maintain a more horizontal state (parallel to substrate surface), whereby the light coupling efficiency can be stabilized and the coupling loss can be reduced.

If the sealing surface tilts at the upper side of the optical element, light refraction occurs with the sealing surface as the boundary, and thus the incident/exit angle of the light passing between the optical element and the incident/exit port becomes wider and the light coupling efficiency degrades the greater the tilt.

The sealing surface on the upper side of the optical element can be maintained horizontal by arranging the first and second sealing surface adjustment members while sandwiching the optical element so that the distance between each sealing surface adjustment member and the optical element becomes the same and having the minimal point of the sealing surface come immediately above (center) of the optical element. As a result, a more stable coupling efficiency can be obtained. Furthermore, if the heights of the first and the second sealing surface adjustment members are equal, the sealing surface on the upper side of the optical element can be maintained horizontal, which is preferable.

Figure 7:
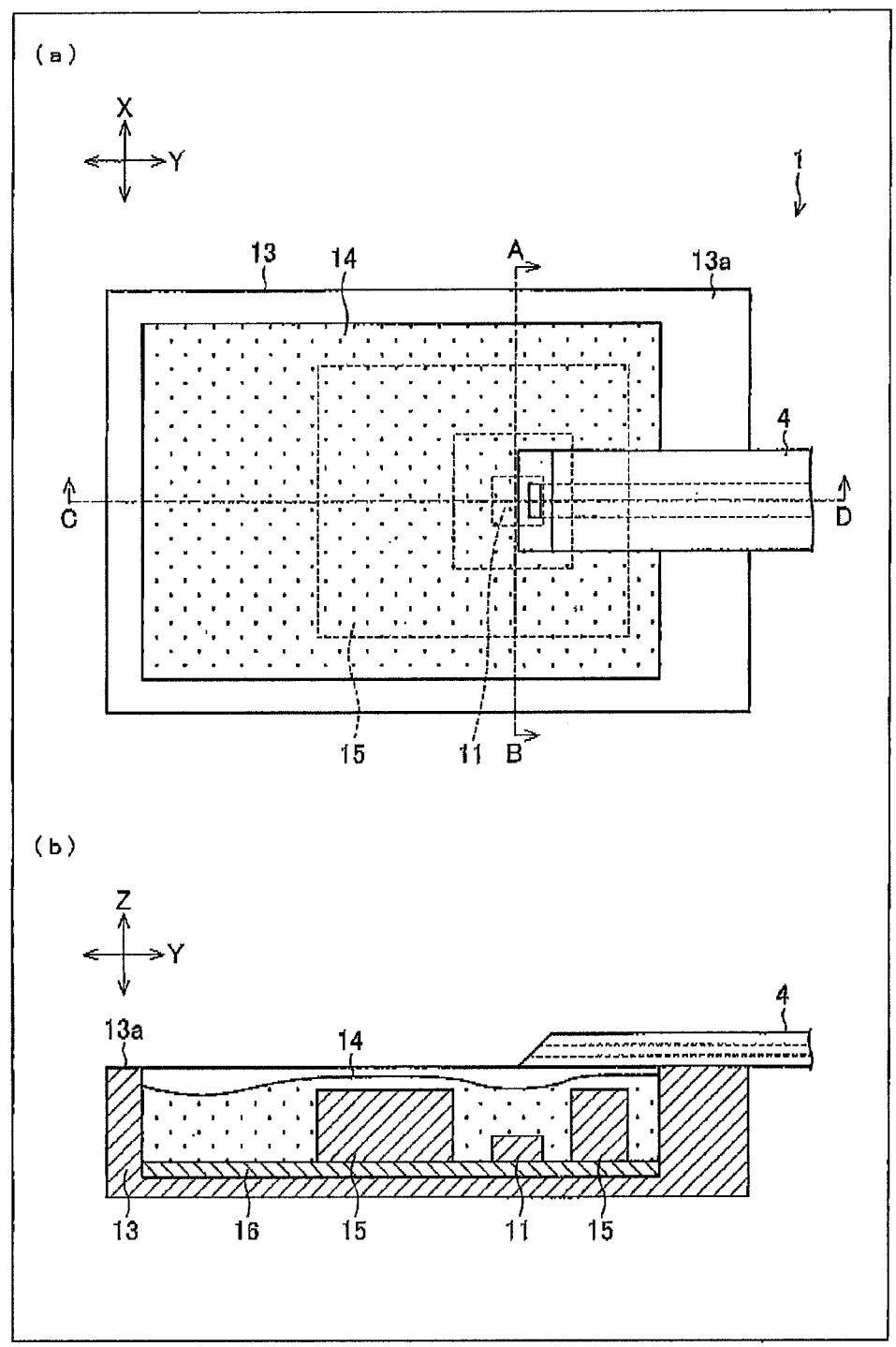
FIG. 7(a) is a plan view showing a configuration of a light transmission module according to another embodiment of the present invention, and (b) is a cross-sectional view taken along line C-D of the light transmission module 1.

Alternatively, in the light transmission path package, the first sealing surface adjustment member and the second sealing surface adjustment member are integrally formed, where the integrally formed sealing surface adjustment members may be formed to have a frame shape, and arranged so as to surround the four sides of the optical element at the substrate surface (e.g., FIGS. 7(*a*) and 7(*b*)).

According to the above configuration, the sealing surface adjustment member surrounds the four sides of the optical element on the interior of each side wall raised from the bottom plate of the light transmission path package. That is, the sealing surface is supported closer to the optical element than the side wall in both directions of the X-axis direction and the Y-axis direction, and the sealing surface approaching (tilting towards) the substrate surface towards the side wall is lifted.

Therefore, the curve of the sealing surface of the portion covering the optical element can be reduced and the tilt can be reduced, whereby the sealing surface can be maintained more flat and horizontal in four directions. As a result, a stable light coupling efficiency can be obtained.

Alternatively, the first sealing surface adjustment member and the second sealing surface adjustment member are integrally formed, and the integrally formed sealing surface adjustment member may be formed to have a U shape and arranged so as to surround three sides of the optical element at the substrate surface (e.g., FIG. 8).

In the light transmission path package, the support member may be a side wall of the light transmission path package.

Alternatively, the support member may be mounted on the substrate so as to surround the region including the optical element and the sealing surface adjustment member at the interior of the light transmission path package, and the sealing resin may be filled in the recess formed by the substrate and the support member.

According to the above configuration, the sealing resin is only filled by a small amount in a small space in the frame of the support member, and thus variation in shape in a case where the sealing surface is formed (tilt and curve of sealing surface) can be suppressed.

Therefore, sealing can be performed with the size (i.e., range smaller than the light transmission path package) of the frame-shaped support member, and thus variation in the shape of the formed sealing surface is eliminated, and the sealing surface can be more stably maintained in a flat and horizontal state. As a result, a stable light coupling efficiency can be obtained.

Furthermore, in the light transmission path package, the sealing surface adjustment member is preferably an electronic element or an electrical element to be mounted on the substrate.

Therefore, the additional member is unnecessary as various types of electrical elements and electronic elements that need to be originally mounted on the substrate are also used as the sealing surface adjustment member 15, whereby a light transmission module of reduced space can be realized.

Furthermore, the electronic device equipped with the light transmission module also fall within the scope of the invention.

The present invention is not limited to the above-described embodiments, and various modifications may be made within the scope of the Claims. In other words, the embodiments obtained by combining the technical means appropriately modified within the scope of the Claims are encompassed in the technical scope of the present invention.

Industrial Applicability

The light transmission module and the light transmission path according to the present invention are applicable to the light communication path between various types of devices, and are also applicable to a flexible optical wiring serving as an in-device wiring mounted in a small and thin commercial-off-the-shelf device.

What is claimed is:

1. A light transmission path package formed by a bottom plate for mounting a substrate and side walls raised from the bottom plate so as to interiorly accommodate at least one end including an incident/exit port of an optical signal of a light transmission path including a core made of material having translucency and a clad made of material having an index of refraction different from an index of refraction of the core, an optical element for transmitting or receiving the optical signal with respect to the end, and the substrate for mounting the optical element, a sealing resin having translucency being filled inside so as to cover the optical element and so as to form a boundary between the optical element and the light transmission path; the light transmission path package comprising:

a first sealing surface adjustment member and a second sealing surface adjustment member, which are arranged with facing each other by way of the optical element on the substrate, having a length in a normal direction of the substrate surface from the substrate surface of a height H2; wherein a relational expression $$H3<H2<H1$$

is satisfied where the height H1 is a distance in the normal line direction from the substrate surface to a surface of the light transmission path facing the substrate surface, and the height H3 is a length in the normal line direction from the substrate surface in the optical element; and the sealing resin is filled so as to cover the first sealing surface adjustment member and the second sealing surface adjustment member and so as not to come in contact with the light transmission path.

2. The light transmission path package according to claim 1, wherein when a direction of arranging the first sealing surface adjustment member, the optical element, and the second sealing surface adjustment member in a line is an X-axis direction and a direction orthogonal to the X-axis direction and parallel to the substrate surface is a Y-axis direction, a length in the Y-axis direction of each sealing surface adjustment member is longer than length of the Y-axis direction in the optical element at a surface on an opposite side of a mounting surface in at least the substrate surface of each sealing surface adjustment member.

3. The light transmission path package according to claim 1, wherein assuming a direction of arranging the first sealing surface adjustment member, the optical element, and the second sealing surface adjustment member in a line is the X-axis direction, a minimal point of a sealing surface of the sealing resin formed between the first sealing surface adjustment and the second sealing surface adjustment member at a cross-section in a direction parallel to the X-axis direction and perpendicular to the substrate surface is within a region formed between the optical element and the light transmission path when projecting a light emitting surface of the optical element in the light transmission path direction in a direction perpendicular to the substrate surface.

4. The light transmission path package according to claim 1, wherein a distance D1 between surfaces facing each other of the optical element and the first sealing surface adjustment member and a distance D2 between surfaces facing each other of the optical element and the second sealing surface adjustment member are equal.

5. The light transmission path package according to claim 1, wherein the first sealing surface adjustment member and the second sealing surface adjustment member are integrally formed; and the integrally formed sealing surface adjustment member is formed to have a frame shape, and is arranged to surround four sides of the optical element at the substrate surface.

6. The light transmission path package according to claim 1, wherein the first sealing surface adjustment member and the second sealing surface adjustment member are integrally formed; and the integrally formed sealing surface adjustment member is formed to have a U shape, and is arranged to surround three sides of the optical element at the substrate surface.

7. A light transmission path package formed by a bottom plate for mounting a substrate and side walls raised from the bottom plate so as to interiorly accommodate at least one end including an incident/exit port of an optical signal of a light transmission path including a core made of material having translucency and a clad made of material having an index of refraction different from an index of refraction of the core, an optical element for transmitting or receiving the optical signal with respect to the end, and the substrate for mounting the optical element, a sealing resin having translucency being filled inside so as to cover the optical element and so as to form a boundary between the optical element and the light transmission path; the light transmission path package comprising:

a sealing surface adjustment member, which is arranged on the substrate facing a support member for supporting the light transmission path by way of the optical element, having a length in a normal direction of the substrate surface from the substrate surface of a height H2;
wherein
a relational expression $$H3<H2<H1$$

is satisfied where the height H1 is a distance in the normal line direction from the substrate surface to a surface of the light transmission path facing the substrate surface, and the height H3 is a distance in the normal line direction from the substrate surface to a surface on an opposite side of a mounting surface at the substrate surface in the optical element; and
   the sealing resin is filled so as to cover the sealing surface adjustment member and so as not to come in contact with the light transmission path.

8. The light transmission path package according to claim 7, wherein the support member is a side wall of the light transmission path package.

9. The light transmission path package according to claim 7, wherein
   the support member is mounted on the substrate so as to surround a region including the optical element and the sealing surface adjustment member inside the light transmission path package; and
   the sealing resin is filled in a recess formed by the substrate and the support member.

10. The light transmission path package according to claim 1, wherein the sealing surface adjustment member is an electronic element or an electrical element mounted on the substrate.

11. A light transmission module comprising:
   an optical element for emitting or receiving an optical signal;
   a light transmission path, including a core made of material having translucency and a clad made of material having an index of refraction different from an index of refraction of the core, for optically coupling with the optical element to transmit an optical signal; and
   the light transmission path package according to claim 1 accommodating the optical element and at least one end including an incident/exit port of the optical signal in the light transmission path.

12. The electronic device comprising the light transmission module according to claim 11.

13. The manufacturing method of the light transmission module according to claim 11, the manufacturing method comprising the steps of:
   a first step of mounting an optical element on the substrate;
   a second step of mounting a sealing surface adjustment member, which has a length in a normal direction of the substrate surface from the substrate surface is a height H2, on the substrate;
   a third step of filling a sealing resin in the light transmission path package so as to cover the sealing surface adjustment member and so as not to come in contact with the light transmission path; and
   a fourth step of mounting the light transmission path;
wherein
a relational expression $$H3<H2<H1$$

is satisfied where the height H1 is a distance in the normal line direction from the substrate surface to a surface of the light transmission path facing the substrate surface, and the height H3 is a length in the normal line direction from the substrate surface in the optical element.

14. The light transmission path package according to claim 7, wherein the sealing surface adjustment member is an electronic element or an electrical element mounted on the substrate.

15. A light transmission module comprising:
   an optical element for emitting or receiving an optical signal;
   a light transmission path, including a core made of material having translucency and a clad made of material having an index of refraction different from an index of refraction of the core, for optically coupling with the optical element to transmit an optical signal; and
   the light transmission path package according to claim 7 accommodating the optical element and at least one end including an incident/exit port of the optical signal in the light transmission path.

\* \* \* \* \*